(12) United States Patent
Saitoh et al.

(10) Patent No.: US 6,991,877 B2
(45) Date of Patent: Jan. 31, 2006

(54) EXPOSURE METHOD AND APPARATUS

(75) Inventors: Kenji Saitoh, Tochigi (JP); Miyoko Kawashima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 148 days.

(21) Appl. No.: 10/128,707

(22) Filed: Apr. 23, 2002

(65) Prior Publication Data

US 2002/0177054 A1    Nov. 28, 2002

(30) Foreign Application Priority Data

Apr. 24, 2001    (JP) ............................... 2001-126777

(51) Int. Cl.
  *G03F 9/00*    (2006.01)
  *G03F 7/20*    (2006.01)
(52) U.S. Cl. .......................... 430/5; 430/311; 430/396
(58) Field of Classification Search ................... 430/5, 430/394, 22, 30, 311, 322, 396
See application file for complete search history.

(56) References Cited

U.S. PATENT DOCUMENTS

| 5,087,537 A | * | 2/1992 | Conway et al. ............... 430/15 |
| 5,153,773 A | | 10/1992 | Muraki et al. ............... 359/619 |
| 5,446,587 A | * | 8/1995 | Kang et al. ................. 359/562 |
| 5,536,602 A | * | 7/1996 | Nakao ............................ 430/5 |
| 5,691,803 A | * | 11/1997 | Song et al. .................... 355/55 |
| 5,715,039 A | * | 2/1998 | Fukuda et al. ................ 355/53 |
| 5,726,741 A | * | 3/1998 | Kye et al. ..................... 355/67 |
| 5,985,491 A | | 11/1999 | Kim et al. ..................... 430/4 |
| 6,150,059 A | | 11/2000 | Tanabe et al. ................. 430/5 |

FOREIGN PATENT DOCUMENTS

| EP | 0 589 103 A1 | 3/1994 |
| EP | 0 915 384 A2 | 5/1999 |
| EP | 0 939 343 A1 | 9/1999 |
| EP | 0 969 327 A2 | 1/2000 |
| JP | 3-215930 | 9/1991 |
| JP | 5-47628 | 2/1993 |
| JP | 11-143085 | 5/1999 |
| JP | 2000-349011 | * 12/2000 |
| JP | 2001-005197 | 1/2001 |

* cited by examiner

*Primary Examiner*—Kathleen Duda
(74) *Attorney, Agent, or Firm*—Morgan & Finnegan, LLP

(57) ABSTRACT

There is provided an exposure method that includes the steps of forming a phase shift mask having a desired pattern and a cyclic dummy pattern overlaid onto the desired pattern, a part of the desired pattern to be resolved by effects of the dummy pattern being thicker than the dummy pattern's line width, illuminating the phase shift mask by using illumination light having a peak near or on an optical axis in an intensity distribution to transfer the desired pattern onto the exposure plane by projecting light having passed through the phase shift mask onto the exposure plane.

23 Claims, 19 Drawing Sheets

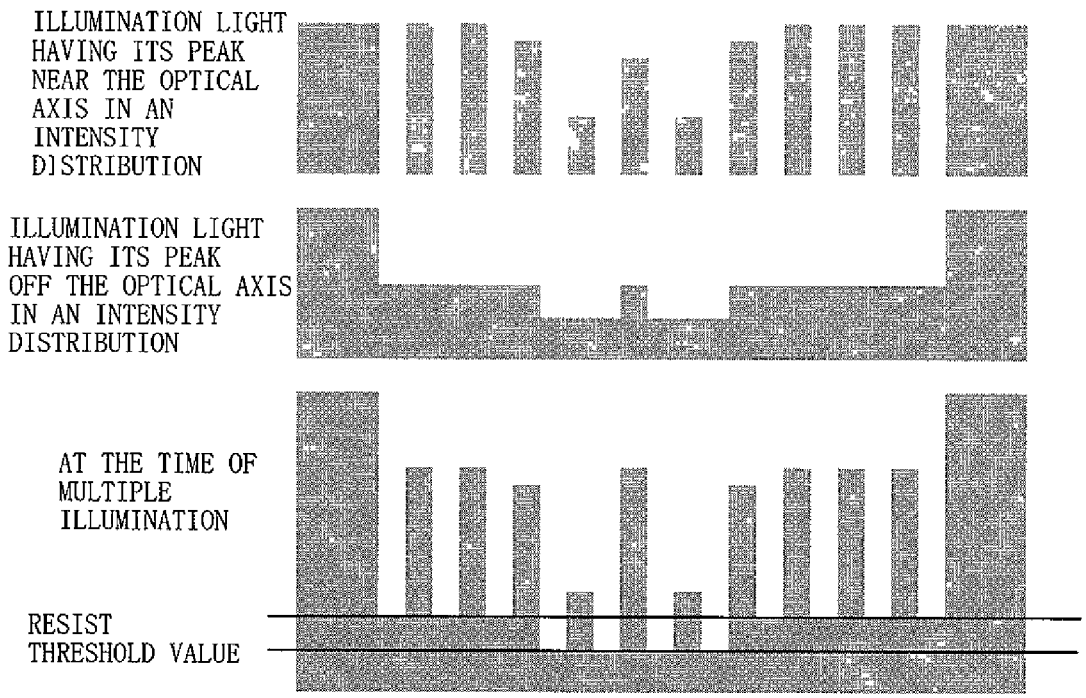
FIG. 8A  INTENSITY DISTRIBUTION AT A CROSS-SECTION
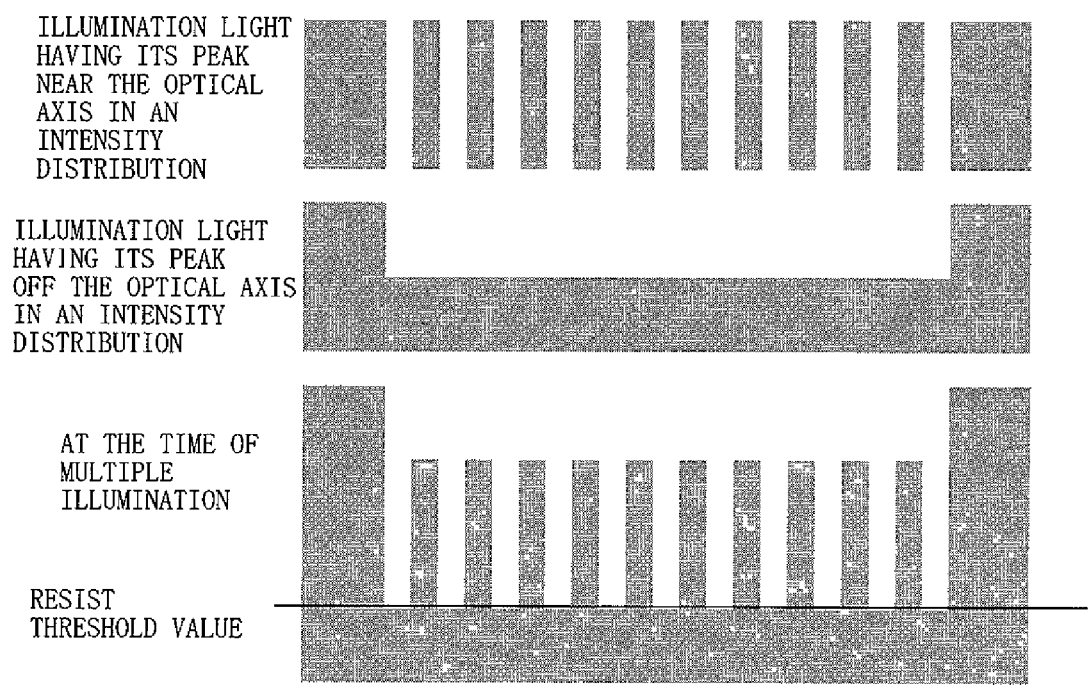
FIG. 8B  INTENSITY DISTRIBUTION AT B CROSS-SECTION

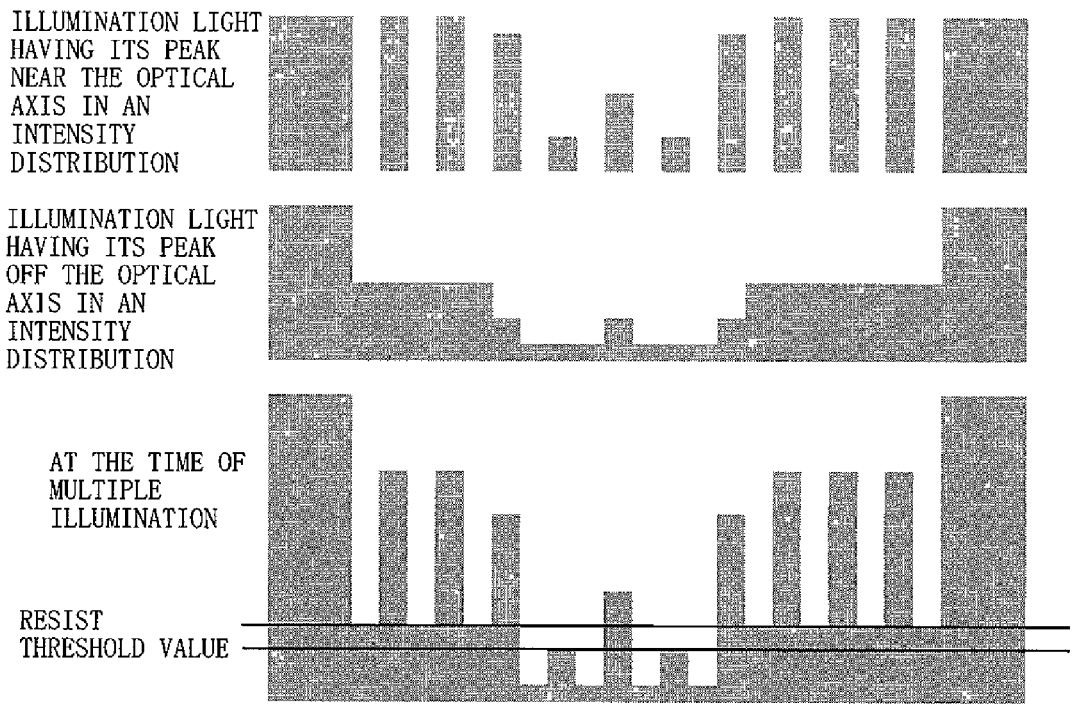
FIG. 10A    C INTENSITY DISTRIBUTION AT C CROSS-SECTION
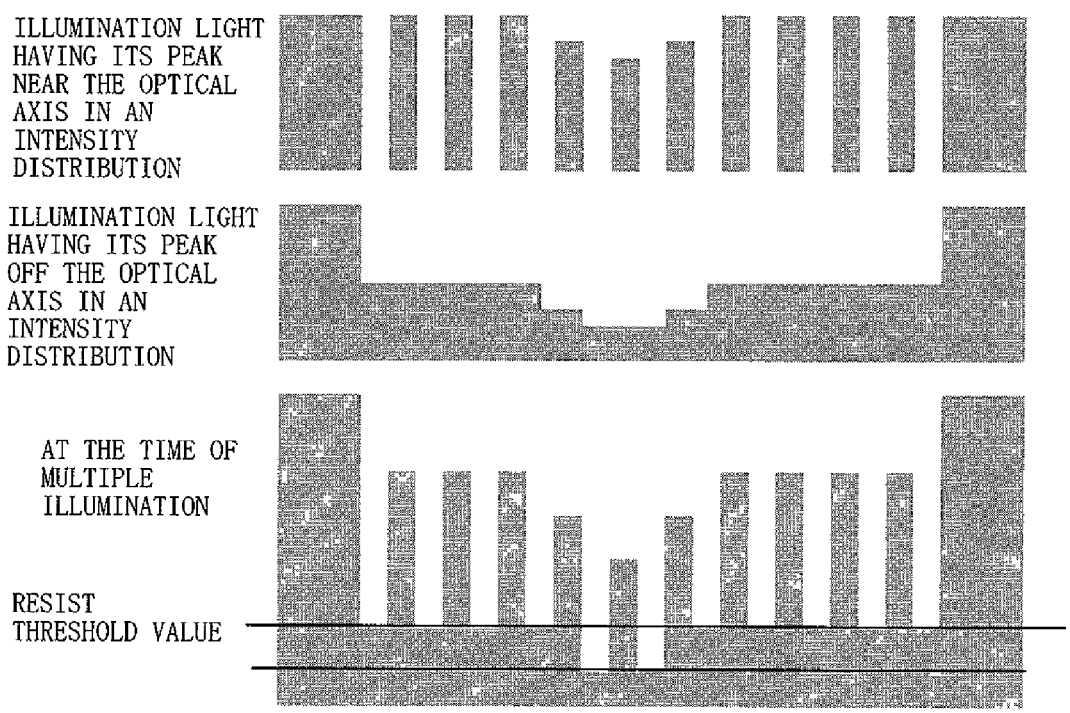
FIG. 10B    INTENSITY DISTRIBUTION AT D CROSS-SECTION

| −0.4 μm | −0.2 μm | 0 μm | 0.2 μm | 0.4 μm |

| −0.4 μm | −0.2 μm | 0 μm | 0.2 μm | 0.4 μm |

| −0.4 μm | −0.2 μm | 0 μm | 0.2 μm | 0.4 μm |

EXPOSURE METHOD AND APPARATUS

BACKGROUND OF THE INVENTION

The present invention relates generally to exposure, and more particularly to exposure apparatuses and methods, device fabricating methods, and devices fabricated from an object to be exposed or a target object. The exposure apparatus and method are used to fabricate various devices including semiconductor chips such as ICs and LSIs, display devices such as liquid crystal panels, sensing devices such as magnetic heads, and image pick-up devices such as CCDs, as well as minute contact hole patterns used for micromechanics. Here, the micromechanics is technology for applying the semiconductor IC fabricating technique for fabrications of a fine structure, thereby creating an enhanced mechanical system that may operate at a level of micron.

A photolithography process uses an exposure apparatus to transfer a mask pattern onto a photosensitive material (resist) which is applied to a silicon wafer, glass plate, etc. (simply called "wafer" hereinafter), and includes steps of an application of resist, exposure, development, etching and a removal of the resist. For the exposure in this series of steps, resolution, overlay accuracy and throughput are three important factors. The resolution is the minimum size for a precise transfer. The overlay accuracy is precision in overlaying multiple patterns on a wafer. The throughput is the number of sheets processed per unit of time.

The fabrication of a device using the lithography technique has employed a projection exposure apparatus that uses a projection optical system to project a pattern drawn on a mask or reticle (these terms are used interchangeably in this application) onto a wafer, thereby transferring the pattern. The projection optical system enables diffracted beams from the pattern to interfere on a wafer and forms an image. The normal exposure enables 0-th order and list order diffracted beams (namely, three beams) to interfere with each other.

Mask patterns include an adjacent and cyclic line and space (L & S) pattern, an adjacent and cyclic contact hole pattern, and isolated contact holes that are non-adjacent and isolated, but to transfer a pattern with high resolution, it is necessary to select optimal exposure conditions (such as illumination conditions, exposure light amounts, etc.) in accordance with kinds of patterns.

The resolution R of a projection exposure apparatus is given by using a wavelength $\lambda$ of a light source and the number of apertures NA in a projection optical system in the following Rayleigh equation:

$$R = k_1 \times \frac{\lambda}{NA} \quad (1)$$

where $k_1$ is a constant determined by a development process and others. In a normal exposure case, $k_1$ is approximately 0.5–0.7.

The recent demand for highly integrated devices have increasingly required minute patterns to be transferred or high resolution. Although the above equation shows that the higher numerical aperture NA and decreased wavelength $\lambda$ would be effective for the higher resolution, improvements of these factors have already reached the limit at the current stage. Thus, it is difficult for normal exposure to form a pattern of less than 0.15 $\mu$m onto a wafer. Accordingly, it has been suggested to employ the phase shift mask technology that enables two beams out of those diffracted beams which have passed through the pattern to interfere with each other, thus forming an image. The phase shift mask reverses by 180° phases of adjacent light-transmitting portions on it, and cancels out the 0-th order diffracted beam, thus enabling two ±1st order diffracted beams to interfere with each other and forming an image. Use of this technique would decrease $k_1$ in the above equation down to substantially 0.25, thus improving the resolution R and forming a pattern of less than 0.15 $\mu$m onto a wafer.

However, although the conventional phase shift mask technique may be effective for such a simple pattern as a cyclic L&S pattern, it has had a difficulty in exposing an isolated pattern and an arbitrarily complicated pattern with high exposure performances (i.e., with high resolution, overlay accuracy, and throughput). In particular, the recent semiconductor industry has been shifting its production to a system chip which includes highly value-added and various types of patterns, and thus it has become necessary to form more than one kind of contact hole pattern on a mask.

On the other hand, as is disclosed in Japanese Laid-Open Patent Application No. 11-143085, it is conceivable to use double exposures (or multiple exposures) with two masks to expose different kinds of patterns separately, but the conventional double exposures require two masks and incur many practical disadvantages: That is, this approach results in an increased cost and lowered throughput because of two exposure steps, as well as requiring high overlay accuracy for two mask exchanges.

Therefore, it is an exemplary object of the present invention to provide an exposure method and apparatus that can expose mask patterns with high resolution and without exchanging the mask, the mask patterns, with a minute line width (e.g., less than 0.15 $\mu$m), which include a mixture of various patterns ranging from an L&S pattern to an isolated and a complicated pattern.

BRIEF SUMMARY OF THE INVENTION

In order to attain the above object, an exposure method as one aspect according to the present invention includes the steps of forming a phase shift mask having a desired pattern and a cyclic dummy pattern overlaid onto the desired pattern, a part of the desired pattern to be resolved by effects of the dummy pattern being thicker than the dummy pattern's line width, illuminating the phase shift mask by using illumination light having its peak substantially on (i.e., near or on) the optical axis in an intensity distribution to transfer the desired pattern onto the exposed plane by projecting light that has passed through the phase shift mask onto the exposed plane via a projection optical system.

Moreover, the exposure method as another aspect of the present invention, which uses a projection lens to expose a pattern on the mask onto the exposed plane, comprises the steps of using a phase shift mask that overlays a minute, cyclic pattern onto the desired pattern area and its neighborhood, and performing multiple illumination through an effective light source, equivalent to small $\sigma$ illumination and large $\sigma$ illumination, as illumination light.

Illumination light having its peak near the optical axis in an intensity distribution (or small $\sigma$ illumination) has, e.g., a circular effective light source shape with $\sigma$ of 0.3 or less, and provokes an interference among 0-th order and ±1st order diffracted beams. In this way, the former exposure method exhibits its effects only by the illumination light having the peak in the neighborhood of the optical axis.

Large σ illumination has, e.g., an annular or quadruple effective light source shape with σ of 0.6 or greater, and brings about an interference between two beams out of the 0-th order and +1st or −1st order diffracted beams. These illumination beams (being arranged at a position conjugate with the projection optical system's pupil in the illumination system) may be realized by a stop that is equipped with an aperture of the above effective light source shape.

The above mentioned exposure method (1) thickens a part of the desired pattern, thus making a difference in an exposure amount with the dummy pattern, (2) uses illumination light having its peak near the optical axis to illuminate the cyclic pattern, (3) uses illumination light having its peak off the optical axis to expose the desired pattern, and (4) properly selects a threshold value for the (resist of the) exposed plane, thus forming the desired pattern onto the exposed plane.

The desired pattern includes a first pattern part in which at least two first lines are lined up at a specified space and a second pattern part that includes a second line with a line width larger than the first line, and may overlay the first line of the first pattern part onto a dark line of the dummy pattern, and overlay the second line of the second pattern part onto the dummy pattern. It is possible to build the minute first line and its neighborhood into a periodic structure, thereby improving resolution performance. The part of the desired pattern is the first line of the first pattern part, and the line width of the first line may be larger than the line width of the dark line of the dummy pattern's line width. By thickening the minute part of the desired pattern slightly, it is possible to make a difference in the exposure amount as against the dummy pattern so as to emphasize the desired pattern.

The desired pattern may be equipped with a light shielding part, while the dummy pattern may not be. Since the exposure amount can be differentiated between the desired pattern and dummy pattern, it is possible to create a pattern with a high contrast. The desired pattern may be adapted such that it includes a light shielding part and a halftone phase shift type light transmitting part. Such a structure would also make a difference in the exposure amount between the desired pattern and dummy pattern for emphasizing the desired pattern.

The exposure apparatus as still another aspect of the present invention includes an exposure mode for accomplishing the above exposure method. In addition, the exposure apparatus as another aspect of the present invention includes a mask, an illumination system that illuminates a pattern on the mask, and a projection optical system which projects the pattern onto an exposed plane, wherein the mask includes a phase shift mask that overlays a minute cyclic pattern onto the desired pattern area and its neighborhood, and the illumination system includes a multiple effective light source corresponding to small σ illumination and large σ illumination, thus having a multiple illumination system combining such small σ illumination and large σ illumination. This exposure apparatus can also perform operations of the above mentioned exposure method.

A device fabricating method as still another aspect of the present invention includes the steps of projecting and exposing the above object to be exposed using the above exposure apparatus, and performing a given process on the projected and exposed object. Claims for the device fabricating method that performs operations similar to those of the above exposure apparatus cover devices as their intermediate products and finished products. Moreover, such devices include, e.g., semiconductor chips such as LSIs and VLSIs, CCDs, LCDs, magnetic sensors, thin-film magnetic heads, etc.

Still, a mask fabricating method as another aspect of the present invention includes the steps of forming a desired pattern onto a mask, overlaying a cyclic dummy pattern onto the pattern, and making a part of the desired pattern thicker than the dummy pattern, thus fabricating the mask as a phase shift mask. Masks fabricated by this method can perform the above operations.

Other objects and further features of the present invention will become readily apparent from the following description of the embodiments with reference to accompanying drawings.

BRIEF DESCRIPTION OF THE DRAWINGS

FIG. 8 is a light intensity distribution generated on the plate shown in FIG. 1 when the phase shift mask shown in FIG. 7 is illuminated by using illumination light having its peak near the optical axis in an intensity distribution and illumination light having its peak off the optical axis in an intensity distribution.

FIG. 10 is a light intensity distribution that appears on the plate of the exposure apparatus shown in FIG. 1 when the mask shown in FIG. 9 is illuminated by using illumination light having its peak near the optical axis in an intensity distribution and illumination light having its peak off the optical axis in an intensity distribution.

DETAILED DESCRIPTION OF THE PREFERRED EMBODIMENTS

Figure 1:
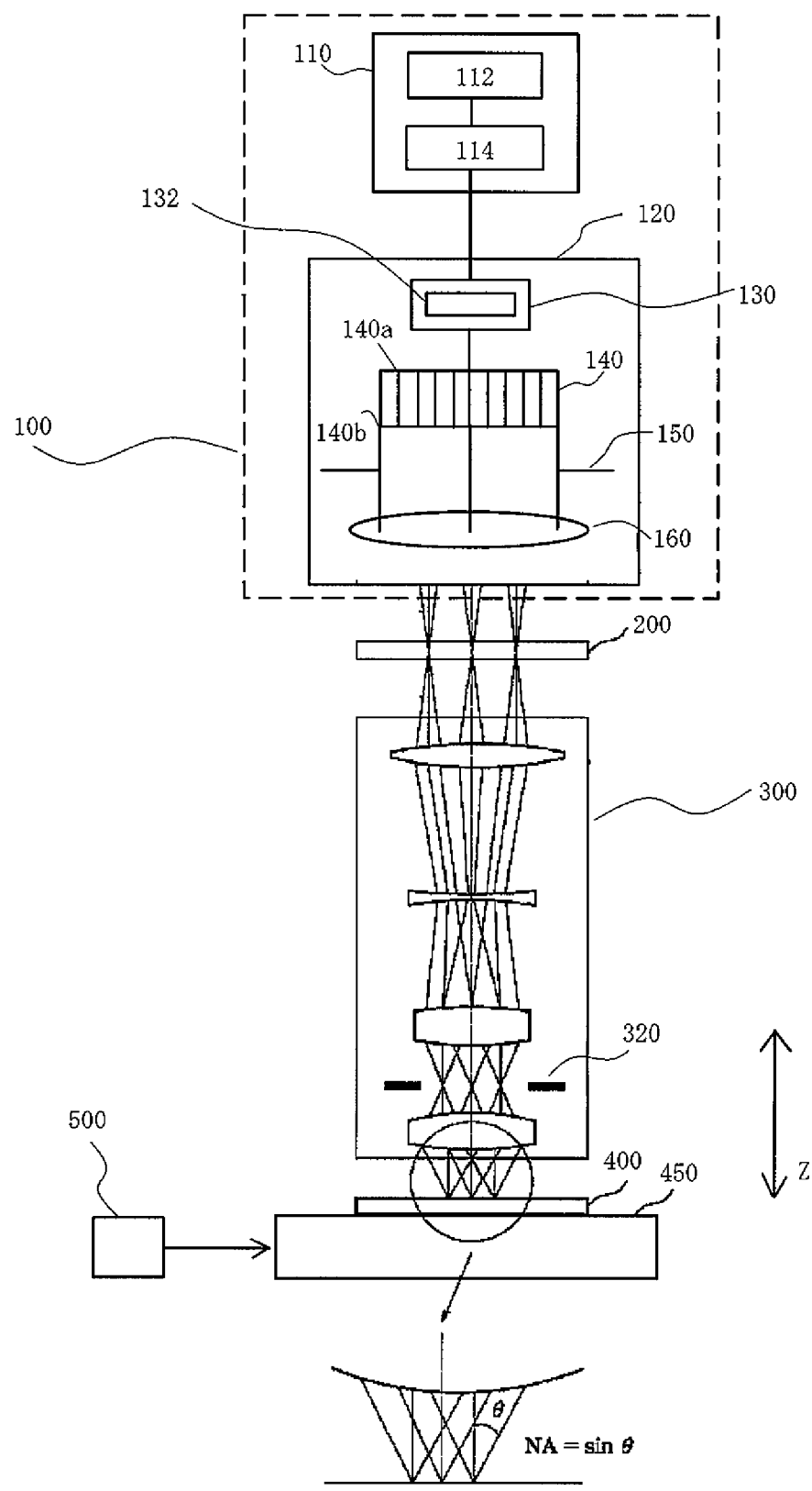
FIG. 1 is a schematic block diagram of an exposure apparatus according to the present invention.

A description will now be given of an exemplary exposure apparatus of the present invention with reference to the accompanying drawings. Here, FIG. 1 is a schematic block diagram of an exposure apparatus 1 according to the present invention. As shown in FIG. 1, the exposure apparatus 1 includes an illumination apparatus 100, a mask 200, a projection optical system 300, a plate 400, a stage 450, and an image-forming position adjuster 500.

The exposure apparatus 1 of the present embodiment is a projection exposure apparatus that exposes onto the plate 400 a circuit pattern created on the mask 200 in a step-and-scan manner, but the present invention can apply a step-and-repeat manner and other exposure manners. The step-and-scan manner, as used herein, is an exposure method that exposes a mask pattern onto a wafer by continuously scanning the wafer relative to the mask, and by moving, after a shot of exposure, the wafer stepwise to the next exposure area to be shot. The step-and-repeat manner is another mode of exposure method that moves a wafer stepwise to an exposure area for the next shot every shot of cell projection onto the wafer.

The illumination apparatus 100 illuminates the mask 200 on which a circuit pattern to be transferred is created, and therefore, includes a light source section 110 and an illumination optical system 120.

The light source section 110 includes laser 112 as a light source, and a beam shaping system 114.

The laser 112 may use pulse laser such as ArF excimer laser with a wavelength of approximately 193 nm, KrF excimer laser with a wavelength of 248, $F_2$ excimer laser with a wavelength of 157 nm, etc. A kind of laser is not limited to excimer laser. For example, YAG laser can be used, and the number of laser units is not limited. For example, if two units of solid laser that operates independently are used, no coherence between these solid laser units exists, and thus speckles arising from the coherence will be reduced considerably. Further, in order to reduce speckles, it would be advisable to oscillate an optical system in a straight or rotating manner. Moreover, a light source applicable to the light source section 110 is not limited to the laser 112, but may use one or more lamps such as a mercury lamp, xenon lamp, etc.

The beam shaping system 114 can use, for example, a beam expander, etc., with a plurality of cylindrical lenses, and convert the aspect ratio of the size of the sectional shape of the parallel beams from the laser 112 into desired values (for example, change the sectional shape from a rectangle to a square), thus reshaping the beam shape to a desired one. The beam shaping system 114 forms a beam that has a size and divergent angle necessary for illuminating an optical integrator 140 described later.

It would be advisable for the light source section 110 to use an incoherently turning optical system, though it is not shown in FIG. 1, that turns a coherent laser beam into an incoherent one. The incoherently turning optical system may use an optical system that includes at least one return system that, for example, as disclosed in FIG. 1 of Japanese Laid-Open Patent Application No. 3-215930, splits an incident beam on a light splitting plane at least into two beams (e.g., p polarized light and s polarized light). The return system then provides one of them, relative to the other beam, with an optical path length difference more than the coherence length of a laser beam via an optical member, and subsequently feeds it back to the splitting plane so that the superimposed light is emitted.

The illumination optical system 120 is an optical system that illuminates the mask 200, and includes a condensing optical system 130, an optical integrator 140, an aperture stop 150, and a condenser lens 160 in the embodiment. The illumination optical system 120 can use any light whether it is on-axial or off-axial light. Further, the illumination optical system 120 in this embodiment may include a masking blade or a scan blade for changing a size of the transfer area onto the plate 400. The illumination optical system 120 in this embodiment comprises a plurality of lenses and necessary mirrors, and makes up an afocal system that is telecentric at the side of exit.

The condensing optical system 130, first, includes a necessary folding mirror(s) and a lens(es), and efficiently introduces a beam that has passed through them into the optical integrator 140. For example, the condensing optical system 130 includes a condenser lens arranged so that the plane of exit of the beam shaping system 114 and the plane of incidence of an optical integrator 140 composed as a fly-eye lens as described later may form an optical relationship of an object plane and a pupil plane (or a pupil plane and an image plane), thereby keeping the chief ray which has passed the lens parallel to any lens element 142 in and around the center of the optical integrator 140. This relationship is sometimes called a Fourier transformation relationship in this application.

The condensing optical system 130 further includes an exposure-amount regulator 132 which can change an exposure amount of illumination light for the mask 200 per illumination. The exposure-amount regulator 132 changes each magnification in the afocal system, thereby altering a sectional shape of an incident beam. Alternately, the exposure-amount regulator 132 may be composed of a zoom lens and the like to move the lens along the optical axis and change the angular magnification. If necessary, the exposure-amount regulator 132 may use a half mirror to split an incident beam, detect an amount of light by a sensor, and regulate, based on the result of the detection, an output of the laser 112 and/or part of the optical system. By replacing an optical element (e.g., light amount regulating (ND) filter) and/or using a zoom lens to change an image-forming magnification, the exposure-amount regulator 132 may also regulate a ratio of the light volume between the central and peripheral parts of the aperture stop 150, which will be described later. As described later, the exposure-amount regulator 132 may regulate the exposure amount based on the desired pattern and/or contrast sought at the plate 400. For example, if much importance needs to be placed on a pattern shape, the exposure amount ratio of the illumination light having its peak near the optical axis should be relatively large, and if much importance needs to be placed on contrast, the exposure amount ratio of the illumination light having its peak off the optical axis should be relatively large. The exposure-amount regulator 132 in this embodiment also serves to regulate a peak position in the illumination light (large σ illumination) having its peak off the axis in its intensity distribution.

Figure 2:
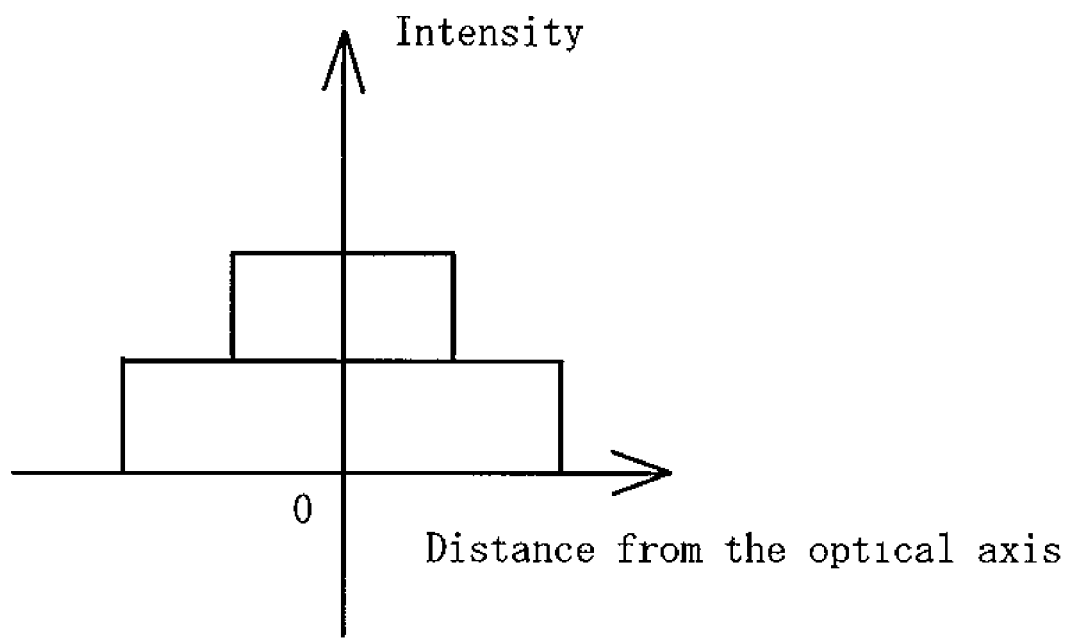
FIG. 2 is a light intensity distribution showing an example of illumination light beams that an exposure amount regulator of the exposure apparatus shown in FIG. 1 can adjust.
Figure 3A:
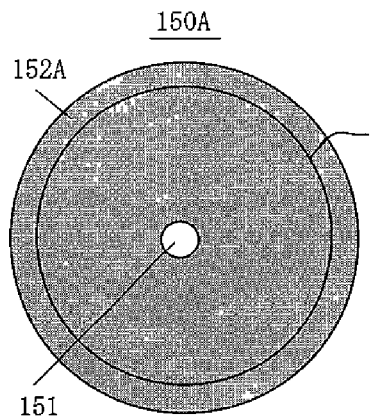
FIG. 3(A) is a schematic plan view of an aperture stop 150A having a circular aperture 151 with a comparatively small radius for producing illumination light having a peak near the optical axis in its intensity distribution.
Figure 3D:
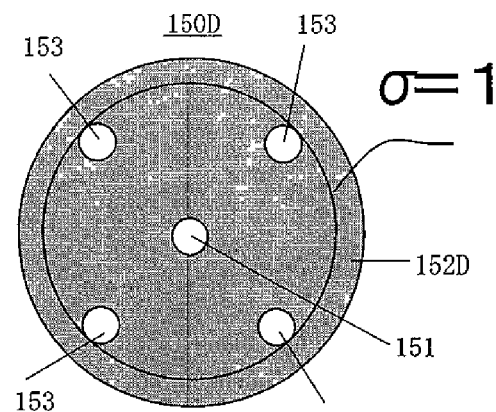
FIG. 3(D) is a schematic plan view of an aperture stop 150D formed as a quintuple-pole illumination stop including a circular aperture 151 shown in FIG. 3(A) and a circular aperture 153 shown in FIG. 3(B).
Figure 3B:
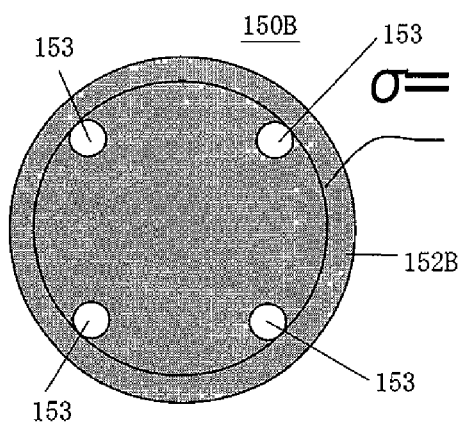
FIG. 3(B) is a schematic plan view of an aperture stop 150B having a light transmitting part including a quadrupole circle 153 with a transmittance of 1, and a light shielding part 152E, the aperture stop 150B for producing illumination light having a peak off the optical axis in its intensity distribution.
Figure 3E:
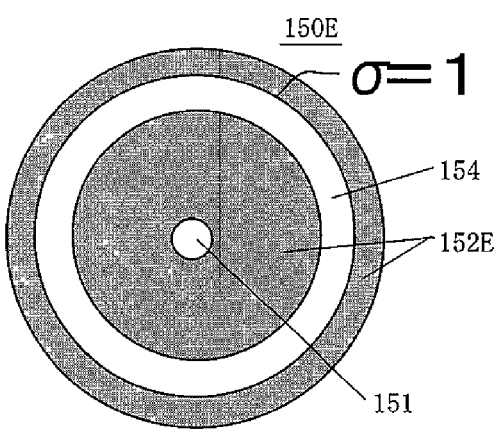
FIG. 3(E) is a schematic plan view of an aperture stop 150E including the circular aperture 151 shown in FIG. 3(A) and the annular aperture 154 shown in FIG. 3(C).
Figure 3C:
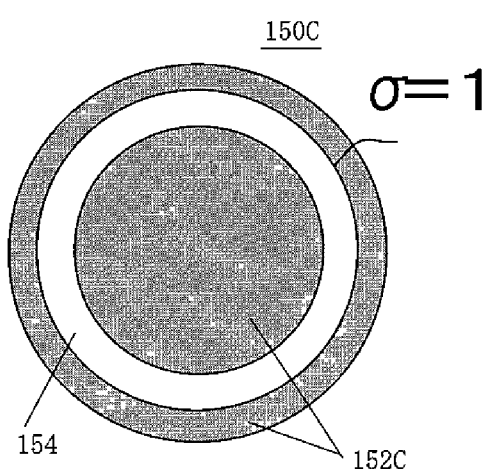
FIG. 3(C) is a schematic plan view of an aperture stop 150C having a light transmitting part including an annular aperture 154 with a transmittance of 1, and a light shielding part 152C, the aperture stop 150C for producing illumination light having a peak off the optical axis in its intensity distribution.
Figure 3F:
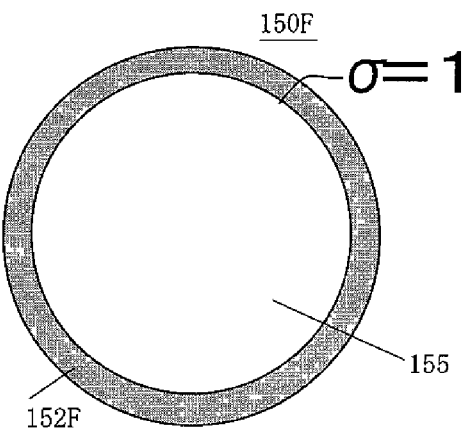
FIG. 3(F) is a schematic plan view of an aperture stop 150F including a circular aperture 155 and a light shielding part 152F.

For example, the exposure amount regulator 132 generates illumination light whose light intensity is higher at the center than around it as shown in FIG. 2, thus making it possible for the aperture stop 150 described later to employ a circular aperture stop 150F as shown in FIG. 3(F). Here, FIG. 2 shows a light intensity distribution of an illumination beam whose light intensity is higher at the center than around it. FIG. 3(F) is a schematic plan view of a circular aperture stop 150F. Further, in this application, "illumination light using such light as has a peak near the optical axis in its intensity distribution" shall include the illumination light shown in FIG. 2. The aperture stop 150F is composed of a circular light transmitting part 155 with a transmittance of 1 and an annular light shielding part 152F with a transmittance of 0.

The optical integrator 140, which makes uniform illumination light that illuminates the mask 200, is structured as a fly-eye lens in the present embodiment, which converts an angular distribution of incident light to a positional distribution, thus exiting the light. The fly-eye lens is so maintained that its plane of incidence 140a and its plane of exit 140b are in the Fourier transformation relationship. However, as described later, the optical integrator 140 usable for the present invention is not limited to the fly-eye lens.

The fly-eye lens 140 arranges a plurality of lenses (lens elements) 142 which have different focus positions on the other plane. A sectional shape of each lens element that forms the fly-eye lens will have higher light use efficiency for the illumination light when it is approximately similar to the illuminated area in the illumination section, provided each lens element has a spherical lens surface. This is because the plane of light incidence and the illuminated area are in the relationship of an object and an image (i.e., a conjugate relationship).

Although this embodiment forms the fly-eye lens by combining many lens elements of a square section in conformity to a shape of the mask 200, the present invention does not exclude those lenses having a circular, rectangular, or hexagonal section or any other shape. The condenser lens 160 superimposes, onto the mask 200, each beam from multiple point-light sources (effective light sources) that is formed at or around the plane of exit 140b of the fly-eye lens. Thus, the entire mask 200 will be illuminated by multiple point-light sources (effective light sources) in a uniform way.

Figure 16:
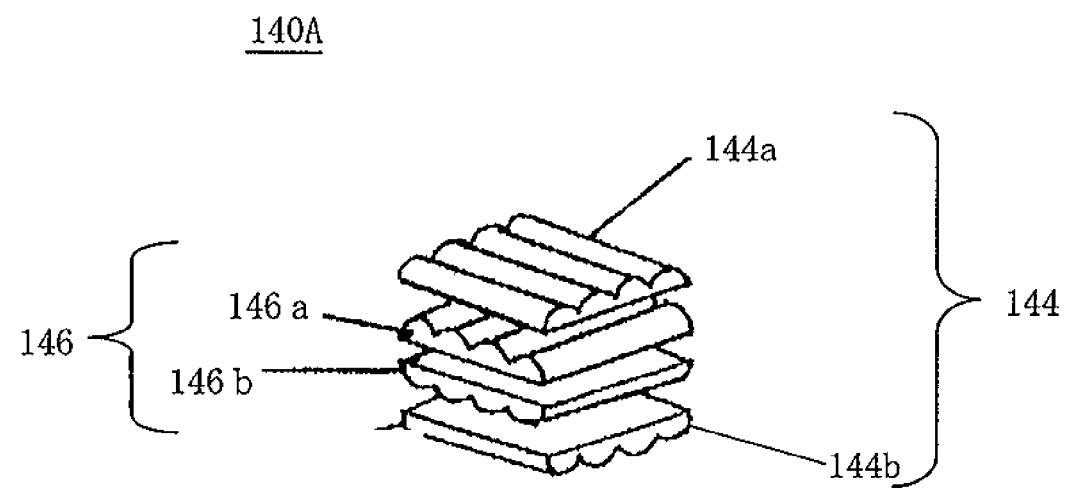
FIG. 16 is an enlarged perspective view of an example of variation of an optical integrator for the exposure apparatus shown in FIG. 1

The optical integrator 140 that can be applied to the present invention is not limited to a fly-eye lens. It may be replaced, for example, by an optical integrator 140A shown in FIG. 16. Here, FIG. 16 is an enlarged perspective view of the optical integrator 140A. The optical integrator 140A is formed by stacking two sets of cylindrical lens array plates 144 or 146 (or lenticular lenses). The cylindrical lens array plates 144a and 144b, in the set of the first and fourth ones, each have a focal distance f1, and the cylindrical lens array plates 146a and 146b, in the set of the second and third ones, each have a focal distance of f2 different from f1. The cylindrical lens array plate in the same set is disposed at the focal position of its partner. The two sets of the cylindrical lens array plates 144 and 146 are arranged at right angle, and create different beams with an F number (namely, a lens' focal distance/effective aperture) in an orthogonal direction. Thus, it is needless to say that the number of sets of the optical integrator 140A is not limited to 2.

The fly-eye lens 140 may be replaced with an optical rod. The optical rod turns an illumination distribution, which has not been uniform at the plane of incidence, uniform at the plane of exit, and has a rectangular section wherein a sectional shape perpendicular to a rod axis has an approximately same aspect ratio as the illuminated area. If the optical rod has power with respect to the sectional shape perpendicular to the rod axis, the intensity of illumination at the plane of exit does not become uniform, and thus the sectional shape perpendicular to the rod axis is a polygon formed only by straight lines. The fly-eye lens 140 may be replaced with a diffractive element exhibiting a diffusive behavior.

Right after the plane of exit 140b of the optical integrator 140 is provided the aperture stop 150 whose shape and diameter are fixed. The aperture stop 150 in this embodiment uses illumination light having a peak near the optical axis in its intensity distribution and illumination light having a peak off the optical axis in its intensity distribution (namely, projects these beams sequentially or as one combined beam), and has an aperture shape for illuminating the mask 200. Thus, the present invention covers a case where two aperture stops are prepared, one of which provides illumination light having a peak near the optical axis in its intensity distribution and the other of which provides illumination light having a peak off the optical axis in its intensity distribution, and uses these aperture stops one-by-one to illuminate the mask 200 twice. One of the characteristics of the present invention is to solve problems that associate with an exchange of the mask 200. So long as the mask 200 is not exchanged, there will be no problem as to exchanging the aperture stop 150. The aperture stop 150 is provided in a conjugate position with the pupil plane 320 of the projection optical system 300. The aperture shape of the aperture stop 150 corresponds to an effective light source shape on the pupil plane 320 in the projection optical system 300.

The illumination light having a peak near the optical axis in its intensity distribution has σ of 0.3 or less, and brings about interference between 0-th order and ±1st order diffracted beams. The illumination light having a peak off the optical axis in its intensity distribution has σ of 0.6 or greater, and brings about two beam interference between 0-th order and +1st or −1st order diffracted beams. Here, a is the numerical aperture (NA) at the side of the mask 200 in the illumination optical system 120 as opposed to NA at the side of the mask 200 in the projection optical system 300. The illumination light having a peak near the optical axis in its intensity distribution is small σ illumination, sometimes called normal illumination. The illumination light having a peak off the optical axis in its intensity distribution is large σ illumination, sometimes called oblique incidence illumination or modified illumination.

Referring now to FIGS. 3–6, a description will be given of exemplary shapes applicable to the aperture stop 150. Here, FIGS. 3–6 are schematic plan views of exemplary shapes of the aperture stop 150. FIG. 3(A) is a schematic plan view of an aperture stop 150A having a circular aperture 151 with a comparatively small radius for producing illumination light having a peak near the optical axis in its intensity distribution. The aperture stop 150A includes a light transmitting part, created by the circle 151, with a transmittance of 1 and a light shielding part 152A.

FIG. 3(B) is a schematic plan view of an aperture stop 150B having a light transmitting part including a quadrupole circle 153 with a transmittance of 1, and a light shielding part 152B, the aperture stop 150B for producing illumination light having a peak off the optical axis in its intensity distribution. The circular aperture 153 produces illumination light with a center position σ=1 or less, each being arranged at ±45° and ±135°. Preferably, the illumination light that each circle 153A provides has equal σ.

FIG. 3(C) is a schematic plan view of an aperture stop 150C having a light transmitting part including an annular aperture 154 with a transmittance of 1, and a light shielding part 152C, the aperture stop 150C for producing illumination light having a peak off the optical axis in its intensity distribution.

FIG. 3(D) is a schematic plan view of an aperture stop 150D formed as a quintuple-pole illumination stop including a circular aperture 151 shown in FIG. 3(A) and a circular aperture 153 shown in FIG. 3(B). Thus, the aperture stop 150D produces illumination light that combines the illumination light having a peak near the optical axis in its intensity distribution and the illumination light having a peak off the optical axis in its intensity distribution. The circles 151 and 153 in the aperture stop 150D have the same size. The aperture stop 150D includes a light transmitting part composed of the circles 151 and 153, with a transmittance of 1, and a light shielding part 152D with a transmittance of 0.

FIG. 3(E) is a schematic plan view of an aperture stop 150E including the circular aperture 151 shown in FIG. 3(A) and the annular aperture 154 shown in FIG. 3(C). Therefore, the aperture stop 150E also produces illumination light that combines illumination light having a peak near the optical axis in its intensity distribution and illumination light having its peak off the optical axis in its intensity distribution. The aperture stop 150E includes a light transmitting part composed of the circles 151 and 154, with a transmittance of 1, and a light shielding part 152D with a transmittance of 0.

Further, the shapes of the apertures 151 and 153 may have a wide range of variations such as a square and other polygons or part of a sector form. Still, σ may exceed 1. A description will now be given of such variations by referring to FIGS. 4 and 5. Here, FIGS. 4(A) and (B) are schematic plan views of aperture stops 150G and 150H which are variations of the aperture stop 150D shown in FIG. 3(D). FIG. 4(C) is a schematic plan view of an aperture stop 150I that is a variation of the aperture stop 150E shown in FIG. 3(E).

The aperture stop 150G includes a light transmitting part composed of a circular aperture 151A slightly larger than the circular aperture 151 and a rectangular aperture 153A with σ partially exceeding 1, with a transmittance of 1, and a light shielding part 152G with a transmittance of 0. The present inventor has discovered that if illumination light with σ partially exceeding 1 is used, a clearer pattern image will be created on the plate 400. The aperture stop 150H includes a light transmitting part, with a transmittance of 1, composed of a circular aperture 151 with σ of 1 or less and a sector-formed aperture 153B, and a light shielding part 152H with a transmittance of 0. The size of the sector-shaped aperture 153B may be arbitrarily adjusted. The aperture stop 150I includes a light transmitting part, with a transmittance of 1, composed of a circular aperture 151 and an annular aperture (or a rectangular aperture) 154A with σ partially exceeding 1, and a light shielding part 152I with a transmittance of 0. The feature of the aperture stops 150G and I is the same as that of the above aperture stop 150D and others, and thus, a detailed description of this will be omitted here.

Figure 5:
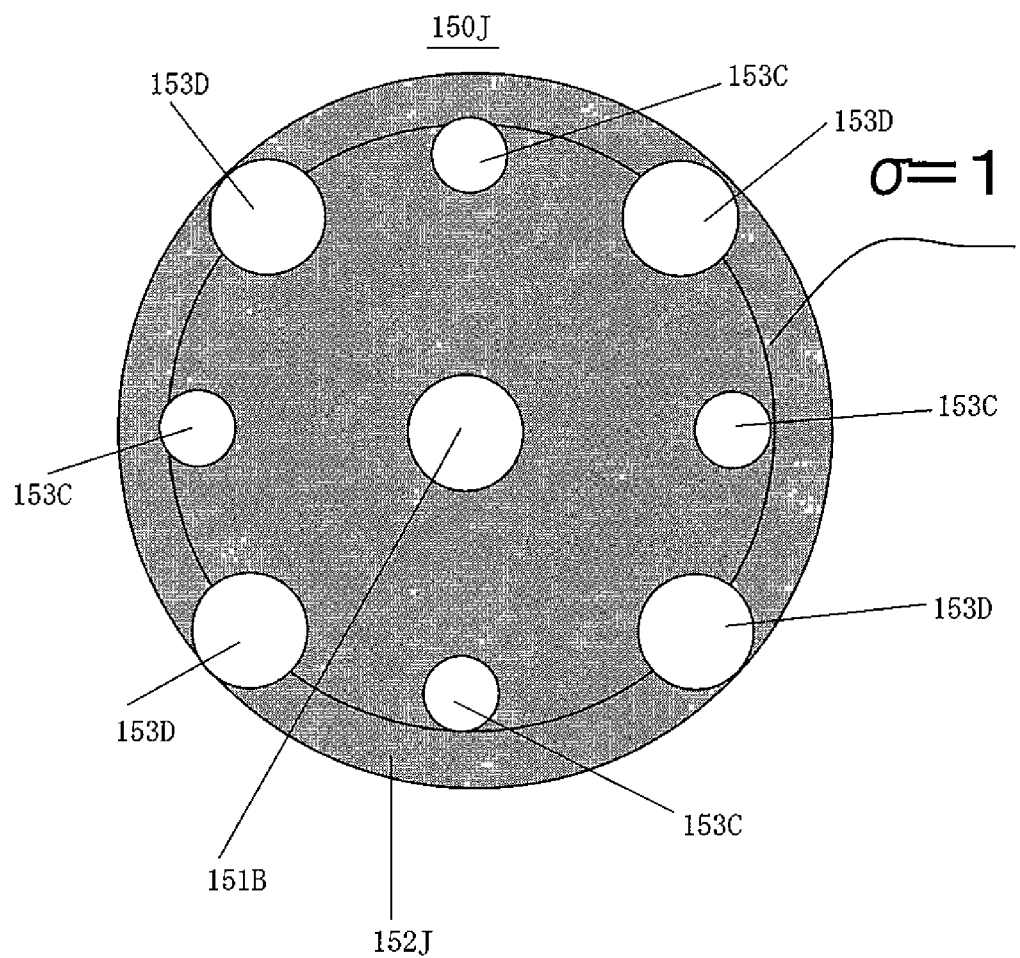
FIG. 5 is a schematic plan view of still another exemplary shape of the aperture stop shown in FIG. 3.

FIG. 5 shows a schematic plan view of an aperture stop 150J formed as a nonuple-pole illumination stop, still another variation applicable to the aperture stop 150. The aperture stop 150J includes a light transmitting part, with a transmittance of 1, composed of a circular aperture 151B slightly larger than the circular aperture 151, a circular aperture 153C with σ at the aperture position being 1 or less, and a circular aperture 153D with σ partially exceeding 1 and with the same size as the circular aperture 151B, and a light shielding part 152J with a transmittance of 0. The circular aperture 153C is provided at the positions of 0°, 90°, 180°, and 270°, and the circular aperture 153D at the positions of ±45°, and ±135°. The feature of the aperture stop 150J is the same as the above aperture stop 150D and others, and thus, a detailed description of this will be omitted here.

For a selection of a desired aperture stop 150 from multiple kinds of aperture stops 150, aperture stops 150A–150J may be arranged, for example, on a disc turret (not shown), and the turret is turned when the aperture stop is to be switched. Thus, the illumination apparatus 120 may use either one of illumination light having its peak near the optical axis and illumination light having a peak off the axis in its intensity distribution to illuminate the mask 200, and then use the other light to illuminate the mask 200. Further, in using the illumination light created by combining the illumination light having a peak on the optical axis and the illumination light having a peak off the axis in its intensity distribution, the exposure-amount regulator 132 may change respective exposure light volume ratios.

The condenser lens 160 condenses as many rays of light exited from the fly-eye lens 140 as possible, and Koehler-illuminates the mask 200 so that the chief rays may become parallel, i.e., telecentric. The mask 200 and the plane of exit 140b of the fly-eye lens 140 are disposed in the Fourier transformation relationship.

The exposure apparatus 1 may have, if needed, a width-variable slit for controlling uneven illumination or a masking blade (a stop or a slit) for regulating an exposure area being scanned. If a masking blade is provided, the masking blade and the plane of exit 140b of the fly-eye lens 140 are disposed in the Fourier transformation relationship, and placed in an optically approximately conjugate position to the plane of the mask 200. Beams that have transmitted an opening section of the masking blade are used as the illumination light for the mask 200. The masking blade is a stop having an automatically variable opening width, thus making vertically changeable the transfer area (of the opening slit) for the plate 400, which will be described later. The exposure apparatus 1 may further have a scan blade, with a structure similar to the above masking blade, which makes horizontally changeable the transfer area (as one shot scan exposure area) for the plate 400. The scan blade is also a stop having an automatically variable opening width, and is installed at an optically approximately conjugate position. Thus, the exposure apparatus 1 can use these two variable blades to set the dimensions of the transfer area in accordance with the dimensions of an exposure shot.

The mask 200 is, e.g., of quartz, on which a circuit pattern (or an image) to be transferred is created, and is supported and driven by a mask stage (not shown). Diffracted light emitted from the mask 200 passes the projection optical system 300, and then, is projected onto the plate 400. The plate 400 is an object to be exposed, onto which resist is applied. The mask 200 and the plate 400 are located in an optically conjugate relationship. The exposure apparatus 1 in this embodiment is a step-and-scan type exposure apparatus (namely, a scanner), and therefore, scans the mask 200 and the plate 400 to transfer a pattern on the mask 200 onto the plate 400. When it is a step-and-repeat type exposure apparatus (i.e., "a stepper"), the mask 200 and the plate 400 are kept stationary for exposure.

The mask stage supports the mask 200, being connected to a transport mechanism (not shown). The mask stage and the projection optical system 300 are installed on a stage body tube surface plate supported via a damper, for example, to the base-frame placed on the floor. The mask stage can use any structure known in the art. The transport mechanism (not shown) is made up of a linear motor and the like, and drives the mask stage in X-Y directions, thus moving the mask 200. The exposure apparatus 1 scans the mask 200 and the plate 400 in a state synchronized by a control mechanism (not shown).

The mask 200 as an aspect of the present invention is formed as a phase shift mask including a desired pattern and a cyclic dummy pattern overlaid onto the desired pattern, wherein a part of the desired pattern to be resolved by effects of the dummy pattern is made thicker than the dummy pattern's line width. The mask forms, e.g., a desired pattern, overlays a cyclic dummy pattern on the desired pattern, and makes a part of the desired pattern thicker than the dummy pattern, thus fabricating a phase shift mask. As described later, the reason for making the part of the desired pattern thicker is to make a difference in an exposure-amount relative to the dummy pattern.

To describe a pattern structure on the mask 200 of the present invention, a description will be first given of a desired pattern. Now, it is assumed that the desired pattern is, for example, like a gate pattern 20 shown in FIG. 6. Here, FIG. 6 is a schematic plan view of the desired pattern.

The gate pattern 20 is composed a pair of pattern parts 21a and 21b (a reference number 21 refers to both unless otherwise described), and each pattern part 21 includes a minute gate part 22 that passes through a B cross-section, and two contact parts 24 that pass through an A cross-section. The gate pattern 20 is made, for example, of chromium.

Figure 6:
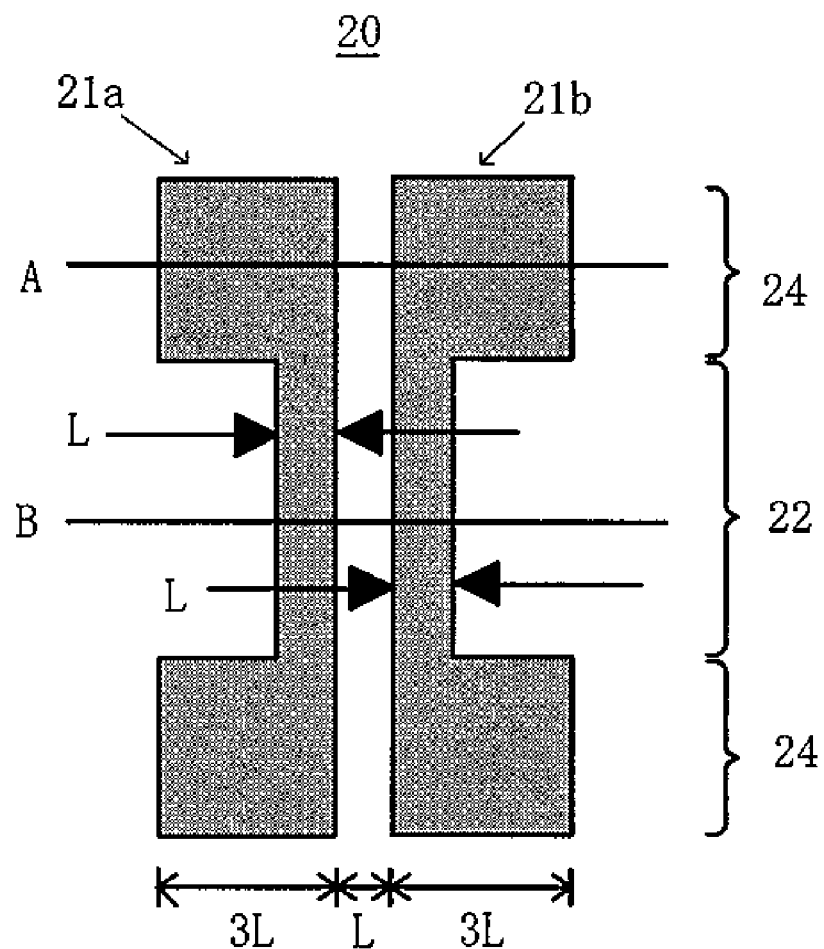
FIG. 6 is a schematic plan view of a desired pattern.

As shown in FIG. 6, both gate parts 22 include a rectangle, respectively, with a minute line width L, lined up in parallel with a minute space L in between. In other words, the gate parts 22 form an L&S pattern in part. L is 0.12 $\mu$m in this embodiment.

The contact parts 24 are, respectively, a rectangle exemplarily having a line width 3L, and two pairs of the contact parts 24 are line up in parallel across the minute space L. Further, each pattern part 21 is provided with the two contact parts 24 at both ends of the gates 22. The present invention aims at simultaneously resolving the gate parts 22 where the minute line widths and space are equal (to L), and the contact parts 24 where line widths (3L) larger than the minimum line width L (of the gate parts 22) are lined up with the minute space L between. The line width L ideal to the present invention depends on $k_1$, a wavelength $\lambda$ of a light source, and NA of a projection optical system shown in the equation. For example, when KrF excimer laser with a wavelength of 248 nm and a projection optical system of NA=0.6 are used, a theoretical resolution R would be 103 nm from the equation 1 provided $K_1$=0.25, and if NA=0.85, R=73 nm, which would become L. Or if ArF excimer laser with a wavelength of 193 nm is used, and NA=0.85, R=57 nm, and this would become L. By the way, $K_1$ can change from 0.25 to about 0.5 (or greater).

To begin with, in order to resolve two gate parts 22, a plurality of cyclic dummy patterns, with a minute line and minute space, having the same pitch are formed at both sides of two gate parts 22 such that a pattern with a cyclic structure is formed. An addition of a dummy pattern to form a cyclic pattern would make it possible to improve a resolution performance and control line widths with high accuracy. This cyclic pattern helps to obtain the highest resolution via a phase shift mask.

Figure 7:
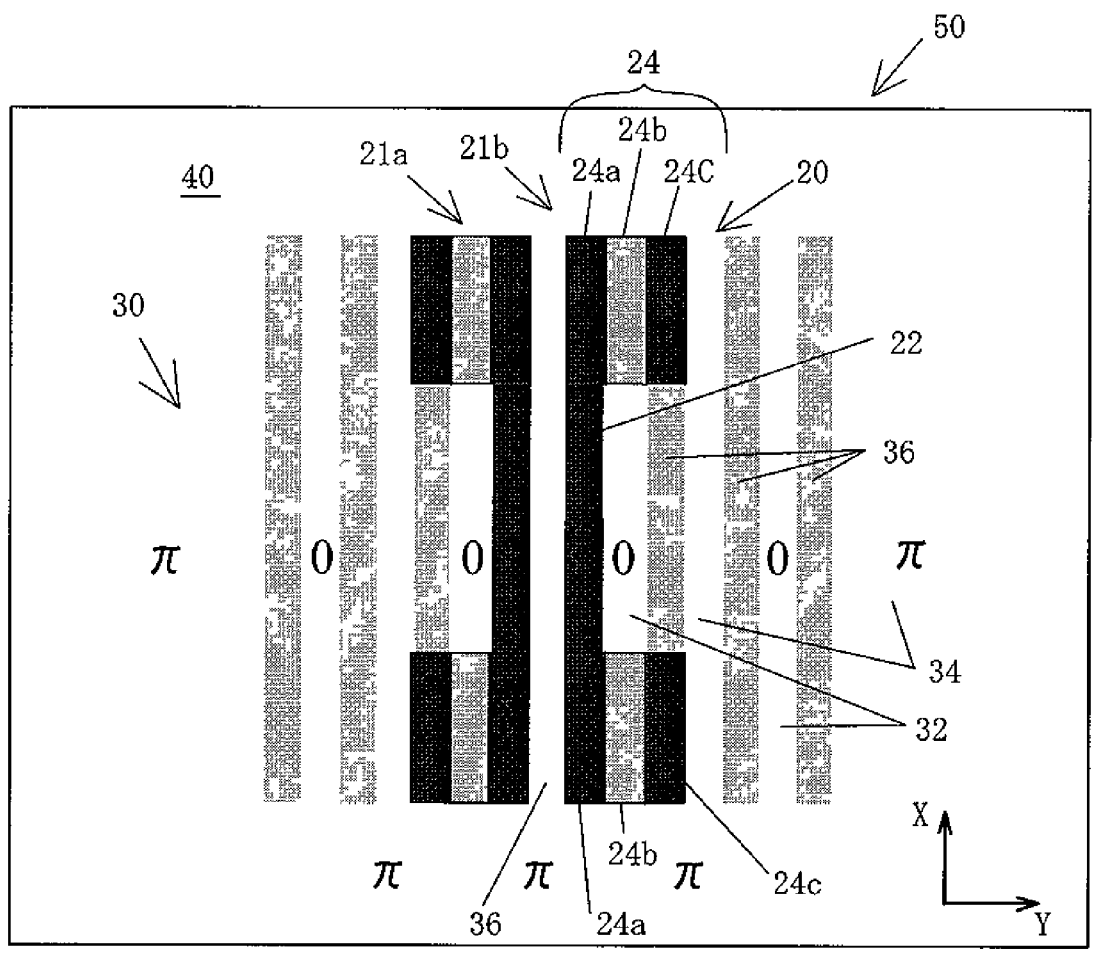
FIG. 7 is an example of a phase shift mask formed by overlaying a dummy pattern onto the pattern shown in FIG. 6.

FIG. 7 shows an example of the phase shift mask 50 that includes a mask pattern 40 created by overlaying a dummy pattern 30 on the desired pattern 20. As shown in this figure, the desired pattern 20 is composed of a pair of the pattern parts 21 as described above. The dummy pattern 30 includes light transmitting parts 32 and 34, and a light shielding part 36 mutually in parallel, and the light transmitting parts and the light shielding part are alternated. The width in Y direction of each of the light transmitting parts 32 and 34 and the light shielding part 36 is equal to L shown in FIG. 6 (0.12 $\mu$m in this embodiment). The light transmitting parts 32 and 34 have a phase set to 0° and 180°, respectively, thus being 180° reversed, and the light transmitting parts 32 and 34 are lined up alternately in Y direction. The light transmitting parts 32 and 34 have a transmittance of 1 (or 100%), and the light shielding part 36 has a transmittance of 0. The light shielding part 36 is, for example, of chromium.

The gate parts 22 of each pattern part 21 are overlaid onto the light shielding part 36 of the dummy pattern 30. The space between the two gate parts 22 may be considered to be part of the desired pattern 20, but here, it is regarded as the light transmitting part 34 whose phase is set to 180°. Further, each contact part 24 includes light shielding parts 24a and 24c, and a light transmitting part 24b onto which the light transmitting part 32 is overlaid. In other words, by referring to FIGS. 6 and 7, it will be understood that the area 24b has changed from a light shielding part to a light transmitting part due to overlaying the dummy pattern 30 onto it. The light transmitting part 24b has a transmittance of 1 (100%), and the light shielding parts 22, 24a and 24c have a transmittance of 0.

Next, the phase shift mask 50 was exposed by employing multiple illumination beams (for example, illumination light produced by the aperture stop 150D shown in FIG. 3(D)) produced as a sum of illumination using illumination light (for example, such illumination light as is produced by the aperture stop 150A shown in FIG. 3(A)) having a peak near the optical axis in its intensity distribution, and illumination light (for example, such illumination light as is produced by the aperture stop 150B shown in FIG. 3(B)) having a peak off the optical axis in its intensity distribution. The result of the light intensity distribution produced on the plate 400 at this time, as described later, is shown in FIG. 8.

FIG. 8(A) shows a light intensity distribution on the plate 400 related to the cross-section including the A cross-section shown in FIG. 6. FIG. 8(B) is a light intensity distribution on the plate 400 related to the cross-section including the B cross-section shown in FIG. 6. The intensity distribution on the plate 400 can be interpreted as an exposure-amount distribution of the resist on the plate 400. By referring to FIG. 8(A), it will be understood that with respect to the A cross-section, the light intensity of the light transmitting part 24b is so high that the contact part 24 cannot be correctly transferred onto the plate 400. By referring to FIG. 8(B), it will be understood that with respect to the B cross-section, the gate part 22 cannot be correctly transferred onto the plate 400 because the dummy pattern 30 persists no matter what resist threshold values are assigned for the plate 400 as described later.

Figure 9A:
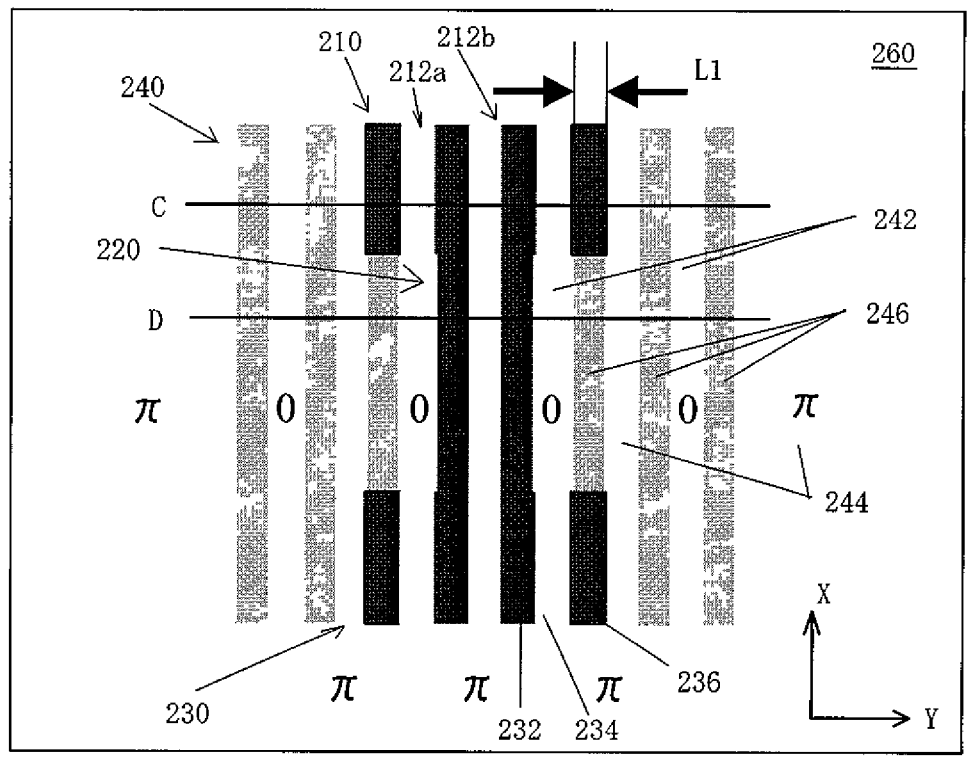
FIG. 9 is a schematic plan view of a phase shift mask according to the present invention.
Figure 9B:
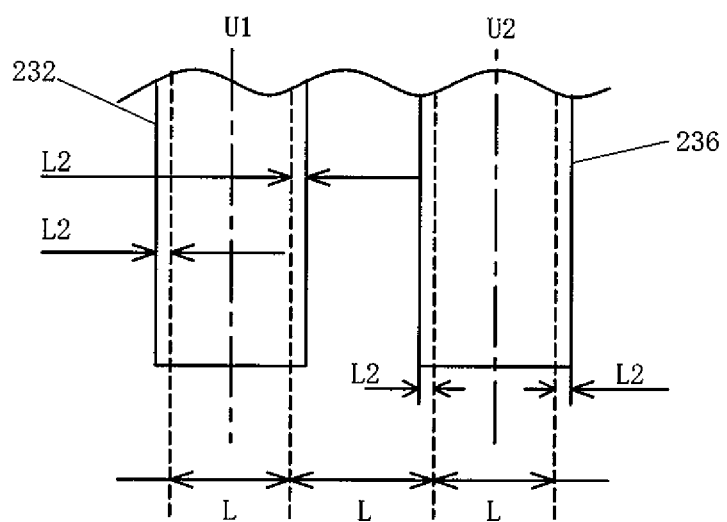
Figure 9C:
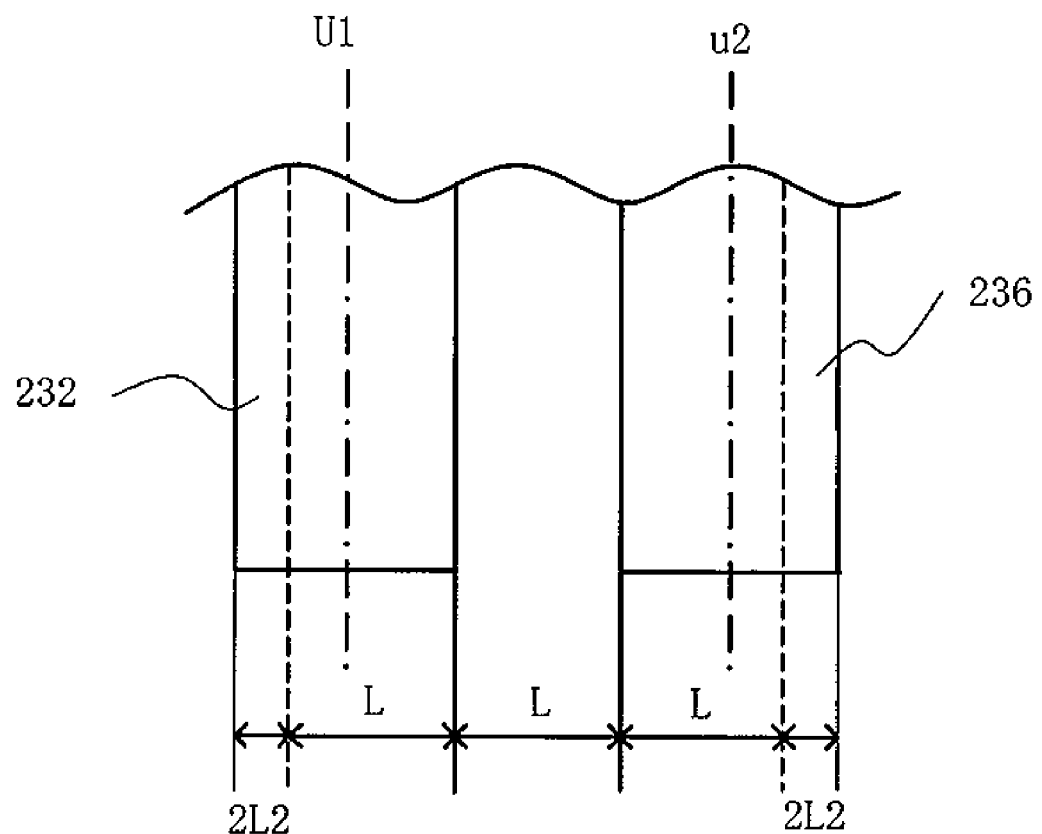

Accordingly, referring to FIG. 7, the desired pattern 20's gate part 22 (namely, the minute portions) was slightly thickened such that a difference was made in an exposure amount relative to the dummy pattern 30 and that the desired pattern 20 was emphasized, and thus, the desired pattern was resolved onto the plate 400. The phase shift mask at this time is the mask 200 as an aspect of the present invention. A description will be given below of the phase shift mask 200 in reference to FIG. 9. Here, FIG. 9(A) is a schematic plan view of the phase shift mask 200. FIG. 9(B) is a partially enlarged view of the phase shift mask 200. FIG. 9(C) is a variation example of the phase shift mask 200 shown in FIG. 9(B). As shown in this figure, the phase shift mask 200 includes a mask pattern 260 composed of a desired pattern 210 partially thickened and a dummy pattern 240.

The desired pattern 210 is similar to the gate pattern 20, but it differs in that it is made partially thicker. The desired pattern 210 is composed of a pair of pattern parts 212a and 212b (the reference number 212 refers to both unless otherwise described), and each pattern part 212 is made up of a minute gate part 220 passing through the D cross-section and two contact parts 230 passing through the C cross-section.

Both gate parts 220 are rectangles each having a minute line width (a line width L1 slightly larger than L), being lined up in parallel with a minute space (a space slightly smaller than L). It is 0.12 μm in this embodiment.

On the other hand, the contact parts 230 are rectangles each having exemplarily a line width slightly larger than the line width 3L, wherein two pairs of contact parts are lined up in parallel with a minute space between (a space slightly smaller than L). Each pattern part 212 has two contact parts 230 installed at both sides of the gate parts 220. The present invention aims at simultaneously resolving the gate parts 220 where such minute line widths and spaces are approximately equal, and the contact parts 230 where line widths larger (namely, line widths slightly larger 3L) than the minimum line width L (of the gate part 220).

In order to resolve two gate parts 220, more than one dummy pattern 240 are formed at both sides of two gate parts 220, and include a cyclic structure of minute lines and minute spaces having the same pitch L. An addition of the dummy pattern 240 to form a cyclic structure enables improvement of a resolution performance and control of a better line width accuracy. This cyclic pattern will obtain the highest resolving power via a phase shift mask.

The dummy pattern 240 includes light transmitting parts 242 and 244 mutually in parallel and a light shielding part 246, wherein the light transmitting parts and the light shielding part 246 are lined up alternately. The widths, in respective Y directions, of the light transmitting parts 242 and 244 and the light shielding part 246 are equal to L (0.12 μm in this embodiment). The light transmitting parts 242 and 244 have a phase set to 0° and 180°, respectively, thus being 180° mutually reversed, and the light transmitting parts 242 and 244 are lined up alternately in Y direction. The light shielding part 246 is, for example, of chromium and the like. The light transmitting parts 242 and 244 have a transmittance of 1 (or 100%), and the light shielding part 246 has a transmittance of 0.

The gate parts 220 of each pattern part 212 are overlaid on the light shielding part 246 of the dummy pattern 240. The space between two gate parts 220 may be considered to be part of the desired pattern 210, but here, it is regarded as the light transmitting part 244 whose phase is set to 180°. Further, each contact part 230 includes light shielding parts 232 and 236, and a light transmitting part 234 on which the light transmitting part 242 is overlaid. In other words, the area 234 has been transformed from a light shielding part to a light transmitting part by overlaying the dummy pattern 240. The transmittance of the light transmitting part 234 is 1 (100%), while the transmittance of the light shielding parts 220, 232 and 236 are 0.

As shown in FIG. 9(A), the line widths of the gate part 220 and the light shielding parts 232 and 236 of the contact parts 230 were originally L, respectively, but now they are enlarged to L1 (>L). Further, by referring to FIG. 9(B), the light shielding parts 232 and 236 respectively are made outward thicker by equally L2 with respect to the center lines U1 and U2 of the light shielding parts 246. As a result, it can be understood that L1=L+2×L2. Further, it will be understood that the line width of the area 234=L−2×L2. Unlike this embodiment, the light shielding parts 232 and 236 may be thickened respectively by applying different widths on the right and left with respect to the center lines U1 and U2, or just on one side of the right and left as shown in FIG. 9(C). In addition, a line width with which the light shielding part 232 is thickened and a line width with which the light shielding part 236 is thickened may be different. The reason for thickening the light shielding parts 232 and 236 in this way is that the desired pattern 210 is differentiated from the dummy pattern 240 in terms of an exposure amount. The ratio according to which the line width L1 is to be thickened against the line width L is, for example, dozens of percentages (e.g., 17%).

In this embodiment, the line width of the gate parts 220 is similar to that of the light shielding part 232 (i.e., L+2×L2 in this embodiment), and thus, a detailed description will be omitted here. As an option, the line width of the gate parts 220 may be different from the light shielding part 232, or with respect to the center line U1, the gate part 220 may be thickened asymmetrically from side to side.

Next, the phase shift mask 200 was exposed by employing multiple illumination beams (for example, illumination light produced by the aperture stop 150D shown in FIG. 3(D)) produced as a sum of illumination light (for example, such illumination light as is produced by the aperture stop 150A shown in FIG. 3(A)) having a peak near the optical axis in its intensity distribution, and illumination light (for example, such illumination light as is produced by the aperture stop 150B shown in FIG. 3(B)) having a peak off the optical axis in its intensity distribution. The result of the light intensity distribution produced on the plate 400 at this time, as described later, is shown in FIG. 10.

FIG. 10(A) is a light intensity distribution on the plate 400, related to the cross-section including the C cross-section shown in FIG. 9(A). FIG. 10(B) is a light intensity distribution on the plate 400, related to the cross-section including the D cross-section shown in FIG. 9(A). The intensity distribution on the plate 400 can be interpreted as an exposure-amount distribution of the resist on the plate 400. If FIG. 10(A) is compared with FIG. 8(A), it will be understood that with respect to the C cross-section, the light intensity of the light transmitting part 234 has decreased compared to the light transmitting part 24b. This is because the line width of the light transmitting 234 has become smaller than L (L−2×L2). For this reason, it will be understood that, if a resist threshold value is assigned properly, the contact part 230 can be transferred to the plate 400. If FIG. 10(B) is compared with FIG. 8(B), it will be understood that with respect to the D cross-section, the light intensity of the light transmitting part 244 in the space of the gate parts 220 has decreased compared to the light transmitting part 34 in the space of the gate parts 22. This is because the line width of the light transmitting 244 in the space of the gate parts 220 has become smaller than L (L−2×L2). For this reason, it will be understood that, if a resist threshold value is assigned properly, the gate part 230 can be transferred to the plate 400. From the above, it will be understood that a proper assignment of a resist threshold value will permit the desired pattern 210 to be correctly transferred to the plate 400.

Figure 12:
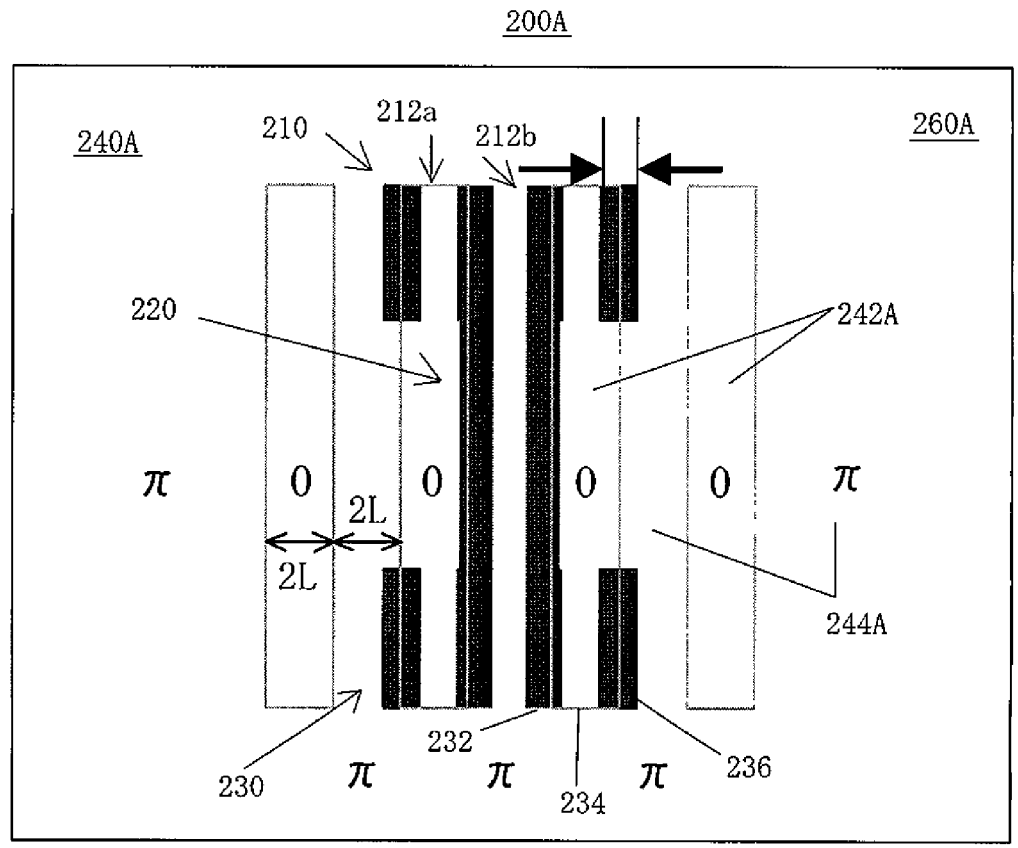
FIG. 12 is a schematic plan view showing an example of variation of the phase shift mask shown in FIG. 9.

Next, by referring to FIG. 12, a description will be given of a mask 200A as a variation example of the mask 200. Here, FIG. 12 is a schematic plan view of the mask 200A. As shown in the same figure, the mask 200A includes a mask pattern 260A composed of the desired pattern 210 and a dummy pattern 240A. The desired pattern 210 is the same as FIG. 9, and so, a description will be omitted.

The dummy pattern 240A is composed of a light transmitting parts 242A and 244A, and the two have a phase set to 0° and 180°, respectively, thus being 180° reversed. The light transmitting parts 242A and 244A each have a width 2L in Y direction, and are line up in parallel alternately in Y direction. In this way, the dummy pattern 240A of this embodiment includes, unlike the dummy pattern 240 shown in FIG. 9, no light shielding part. Therefore, it is only the desired pattern 210 that includes a light shielding part made of chromium an the like. By adopting such a chromium-less structure, it is possible to make a difference in an exposure amount between the desired pattern 210 and the dummy pattern 240A.

In other words, since the line width of the light transmitting part 234 is smaller than that of the light transmitting parts 242A and 244A, it will be understood that the exposure amount at the central part of FIG. 8(A) decreases similarly to the exposure amount shown at the central part of FIG. 10(A). Similarly, since the width of the light transmitting part 244A placed between two pairs of light shielding parts 232 (and the light transmitting part 244A placed between a pair of gate parts 220) is smaller than that of the light transmitting parts 242A and 244A, it will be understood that the exposure amount at the central part of FIG. 8(B) will decrease similarly to the exposure amount shown at the central part of FIG. 10(B). As a result, it is possible to transfer the desired pattern 210 onto the plate 400 with a good contrast.

Further, it will be understood that a similar effect will be produced even when a line width at a boundary where the phase reverses in the desired pattern 210 is properly set to control the exposure amount of the desired pattern 210 and the dummy pattern 240 optimally.

Figure 14:
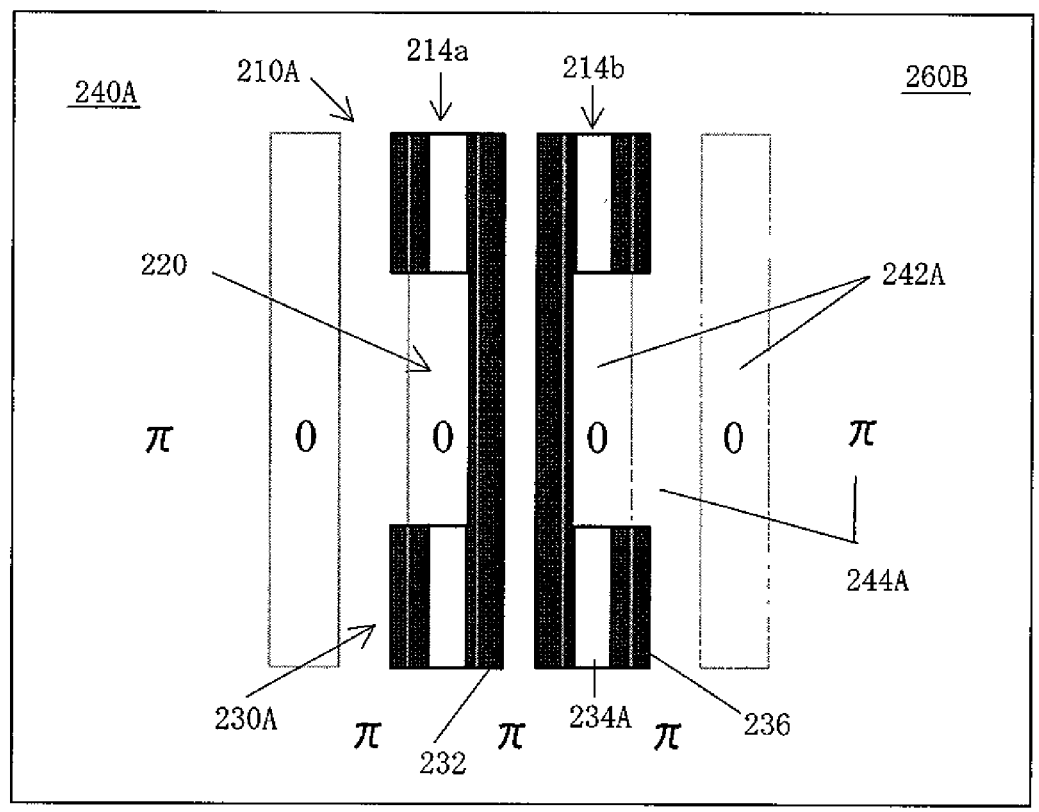
FIG. 14 is a schematic plan view showing another example of variation of the phase shift mask shown in FIG. 9.

In the next place, by referring to FIG. 14, a description will be given of a mask 200B as a variation example of the mask 200. Here, FIG. 14 is a schematic plan view of the mask 200B. As shown in the same figure, the mask 200B includes a mask pattern 260B composed of the desired pattern 210A and a dummy pattern 240A. The dummy pattern 240A is the same as FIG. 12, and so, a description will be omitted.

As shown in FIG. 14, the desired pattern 210 is composed of a pair of pattern parts 214a and 214b (the reference number "214" refers to both unless otherwise described), and each pattern part 214 includes the gate part 220 and a pair of contact part 230A. Each contact part 230A includes the light transmitting part 234A and the light shielding parts 232 and 236. The gate part 220 and the light shielding parts 232 and 236 are the same as those described by referring to FIG. 9, and so, a description of them will be omitted here.

The light transmitting part 234A has a transmittance set not to 1 (100%), but to 0.7 (70%). This would make it possible to make a difference in an exposure amount between the desired pattern 210A and the dummy pattern 240A. In other words, since the width of the light transmitting part 234A is smaller than that of the light transmitting parts 242A and 244A, and has a lower transmittance, it will be understood that the exposure amount at the central part of FIG. 8(A) decreases similarly to the exposure amount shown in the central part of FIG. 10(A).

Furthermore, it will be understood that if the light transmitting part 234A is used, the dummy pattern 240A may remain to be the dummy pattern 240. Further, the transmittance of the light transmitting part 244A placed between two pairs of the light shielding parts 232 (and the light transmitting part 244A placed between a pair of the gate parts 220) can naturally be set to 0.7 (70%) in a similar way.

In this way, by controlling a light transmittance of part of the desired pattern (including the space of the pattern part 212), it is possible to transfer the desired pattern 210 to the plate 400 with a good contrast.

Turning back to FIG. 1, the projection optical system 300 includes an aperture stop 320 for forming an image onto the plate 400 from diffracted light that has passed through the mask pattern 260 formed on the mask 200. The projection optical system 300 may use an optical system solely composed of a plurality of lens elements, an optical system comprised of a plurality of lens elements and at least one concave mirror (a catadioptric optical system), an optical system comprised of a plurality of lens elements and at least one diffractive optical element such as a kinoform, and a full mirror type optical system, and so on. Any necessary correction of the chromatic aberration may use a plurality of lens units made from glass materials having different dispersion values (Abbe values), or arrange a diffractive optical element such that it disperses in a direction opposite to that of the lens unit. As stated above, the shape of an effective light source formed on the pupil plane of the projection optical system 300 is the same as those shown in FIGS. 3–5.

The plate 400 is a wafer in this embodiment, but it may include a liquid crystal plate and a wide range of other objects to be exposed. Photoresist is applied onto the plate 400. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photo resist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The plate 400 is supported by the wafer stage 450. The stage 450 may use any structure known in the art, and thus a detailed description of its structure and operations is omitted. For example, the stage 450 uses a linear motor to move the plate 400 in X-Y directions. The mask 200 and plate 400 are, for example, scanned synchronously, and the positions of the mask stage and wafer stage 450 (not shown) are monitored, for example, by a laser interferometer and the like, so that both are driven at a constant speed ratio. The stage 450 is installed on a stage surface plate supported on the floor and the like, for example, via a dumper, and the mask stage and the projection optical system 300 are installed on a body tube surface plate (not shown) supported, for example, via a dumper to the base-frame placed on the floor.

The image-forming position adjuster 500, which is connected to the stage 450, moves the plate 400, together with the stage 450, in a direction Z (shown in FIG. 1) within a range of the depth of focus, thus adjusting the image-forming position of the plate 400. If necessary, the exposure apparatus 1 performs a number of exposure operations for the plate 400 disposed in different positions to the direction Z, thereby eliminating dispersions in the image-forming performance within the depth of focus. The image-forming position adjuster 500 may use any techniques known in the art such as a rack (not shown) extensible in the direction Z, a pinion (not shown) connected to the stage 450 and mobile on the rack, a means for rotating the pinion, and the like, and thus a detailed description thereof will be omitted.

In an exposure operation, beams emitted from the laser 112 are reshaped into a desired beam shape by the beam shaping system 114, and then enter the illumination optical system 120. The condensing optical system 130 guides the beams, which passed through it, to the optical integrator 140 efficiently. At that time, the exposure-amount regulator 132 adjusts the exposure amount of the illumination light. The optical integrator 140 makes the illumination light uniform, and the aperture stop 150 forms the illumination light combining the illumination light having a peak near the optical axis in its intensity distribution and the illumination light having a peak off the axis in its intensity distribution. Such illumination light illuminates, through the condenser lens 160, the phase shift mask 200 under optimal conditions.

On the mask 200 is formed a mask pattern 260 composed of the desired pattern 210 whose line width is partially thickened and the dummy pattern 240 overlaid onto the pattern 210. The gate part 220 is overlaid onto the light shielding part (dark line part) of the dummy pattern 240, and forms an L&S pattern together with the dummy pattern 240, and thus, its resolution performance is enhanced via the phase shift mask. Further, the gate parts 220 are made thicker, and the light transmitting part in between has decreased the exposure amount compared to the dummy pattern 240. The contact parts 230 are overlaid onto the dummy pattern 240, and a part thereof (the area 234) changes into the light transmitting part, other parts (namely, the light shielding parts 232 and 236) are made thicker than the line width of the dummy pattern 240, and as a result, the exposure amount of the light transmitting part 234 has decreased compared to the dummy pattern 240.

Beams having passed the mask 200 are demagnified and projected under a specific magnification onto the plate 400 due to the image-forming operation of the projection optical system 300. The exposure apparatus of a step-and-scan type would fix the light source section 110 and the projection optical system 300, and synchronously scan the mask 200 and plate 400, then exposing the entire shot. Further, the stage 450 of the plate 400 is stepped to the next shot, thus exposing and transferring a large number of shots on the plate 400. If the exposure apparatus 1 is of a step-and-repeat type, exposure would be performed with the mask 200 and the plate 400 in a stationary state.

Illumination light having a peak near the optical axis in its intensity distribution illuminates the phase shift mask 200, and forms an intensity distribution of a minute cyclic pattern onto the plate 400. Illumination light having a peak off the axis in its intensity distribution illuminates the mask 200, and exposes it roughly. The light transmitting parts 244 and 234 placed between the gate parts 220 of the phase shift mask 200 decrease the exposure amount since the pattern width is marrow, thus contributing to separate the desired pattern 210 from the dummy pattern 240. Consequently, a proper selection of a resist threshold value for the plate 400 would make it possible to form a pattern of the desired contact holes 210 onto the plate 400. As a result, the exposure apparatus 1 can perform a pattern transfer to the resist with high precision, thus providing high quality devices (such as semiconductor devices, LCD devices, image pick-up devices (such as CCDs), thin film magnetic heads, and the like).

Figure 17:
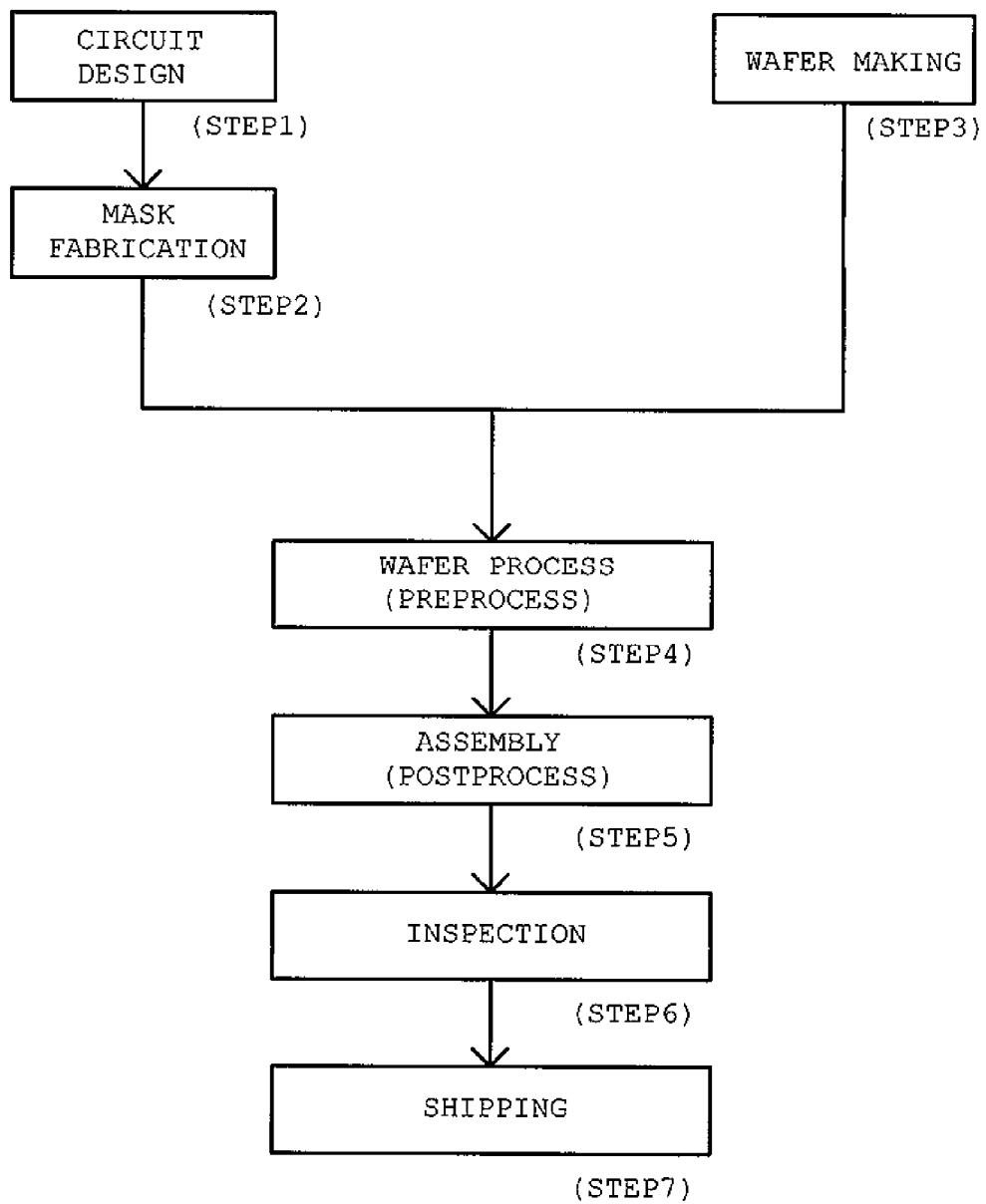
FIG. 17 is a flowchart for explaining a device fabricating method using the exposure apparatus of the present invention.
Figure 18:
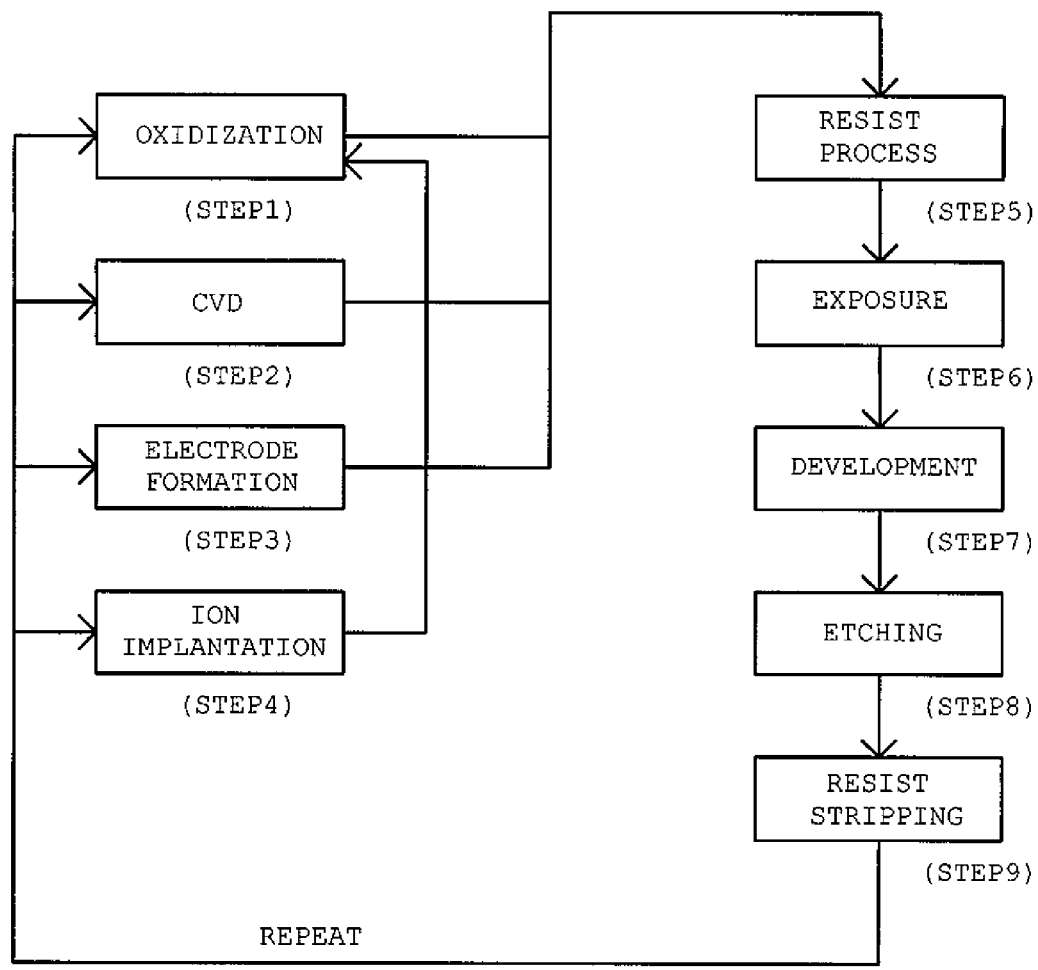
FIG. 18 is a detailed flowchart for Step 4 shown in FIG. 17.

Referring to FIGS. 17 and 18, a description will now be given of an embodiment of a device fabricating method using the above mentioned exposure apparatus 1. FIG. 17 is a flowchart for explaining how to fabricate devices (i.e., semiconductor chips such as IC and LSI, LCDs, CCDs, etc.). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through photolithography of the present invention using the mask and wafer. Step 5 (assembly), which is also referred to as a posttreatment, forms into a semiconductor chip the wafer formed in step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 18 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 1 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer.

EXAMPLE 1

Figure 4A:
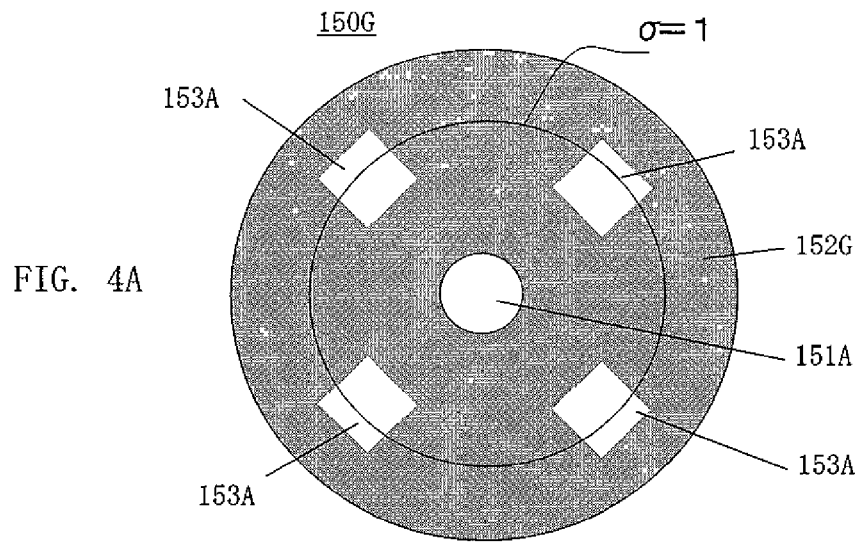
FIG. 4 is a schematic plan view of another exemplary shape of the aperture stop shown in FIG. 3.
Figure 4B:
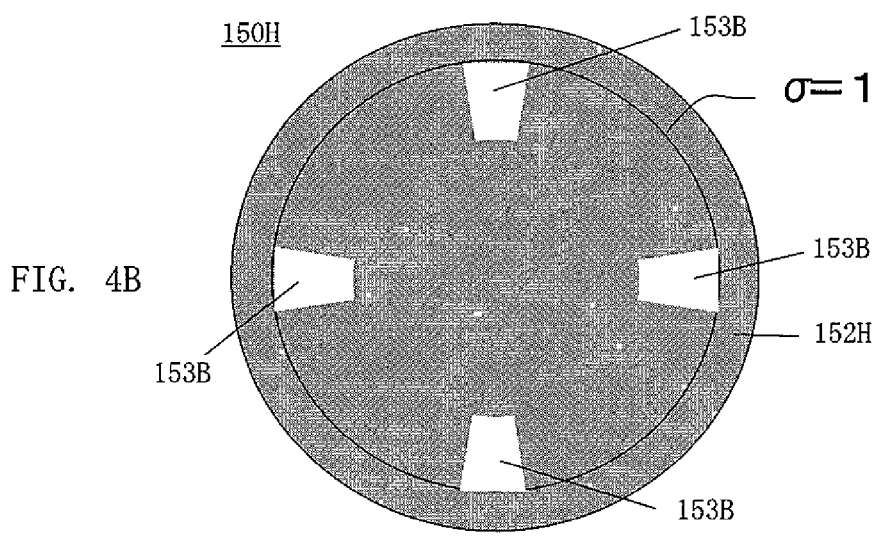
Figure 4C:
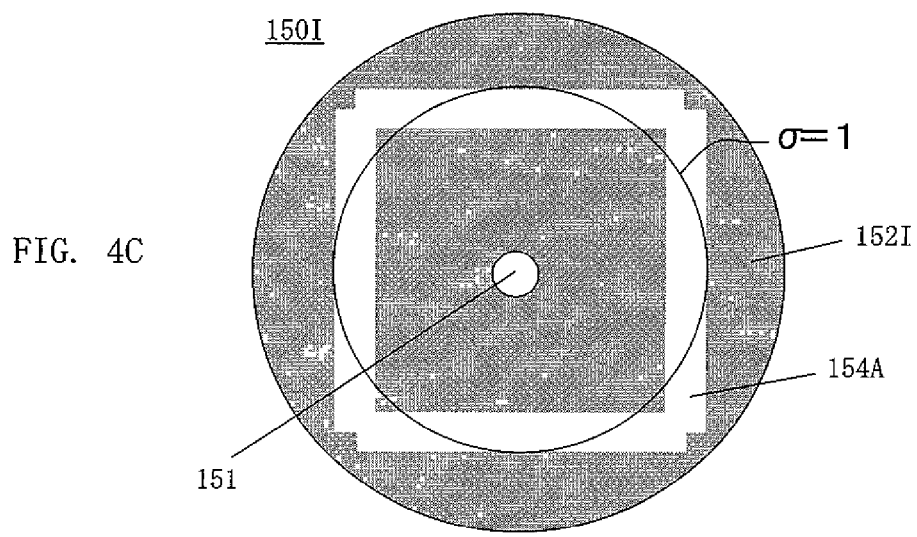

The example 1 uses the phase shift mask 200 shown in FIG. 9, KrF excimer (with a wavelength of 248 nm) as the laser 112, the aperture stop 150G shown in FIG. 4(A), and the projection optical system of NA=0.60 for the exposure apparatus 1. In the phase shift mask 200, let L shown in FIG. 9(B) be 120 nm as calculated on the wafer (plate 400) plane, and let L1 be 140 nm (namely, L2=10 nm). The dummy pattern 240 uses an L&S pattern of 120 nm.

On such an exposure apparatus 1, an exposure operation was performed, respectively, by using illumination light (such as the illumination light produced by the aperture stop 150A shown in FIG. 3(A)) having a peak near the optical axis in its intensity distribution, quadrupole illumination light (such as the illumination light produced by the aperture stop 150B shown in FIG. 3(B)) having a peak off the axis in its intensity distribution (let σ at the central position of each circular aperture be to the position of 0.6 respectively in x-y directions, and the size σ of each circular aperture be 0.3), and quintuple-pole illumination light (such as the illumination light produced by the aperture stop 150D shown in FIG. 3(D)) that combines illumination light having a peak near the optical axis in its intensity distribution and illumination light having a peak off the axis in its intensity distribution (a at the central part is 0.3, and others are the same as the quadrupole illumination light). Further, by using the exposure-amount regulator 132, the intensity ratio between the quintuple-pole illumination light's illumination light having a peak near the optical axis in its intensity distribution and its illumination light having a peak off the axis in its intensity distribution was set to 0.9 to 0.1.

Figure 11A:
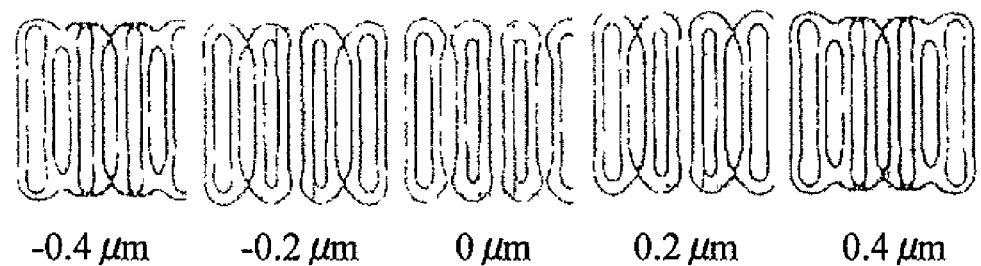
FIG. 11 is a pattern transferred to the plate when, as an exposure result of the first embodiment, the phase shift mask shown in FIG. 9 is illuminated under different illumination conditions.
Figure 11B:
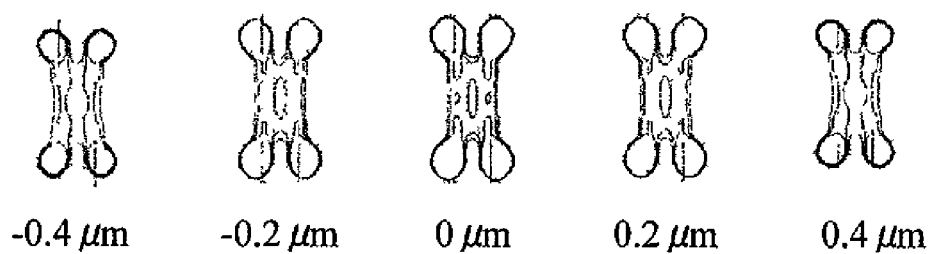
Figure 11C:
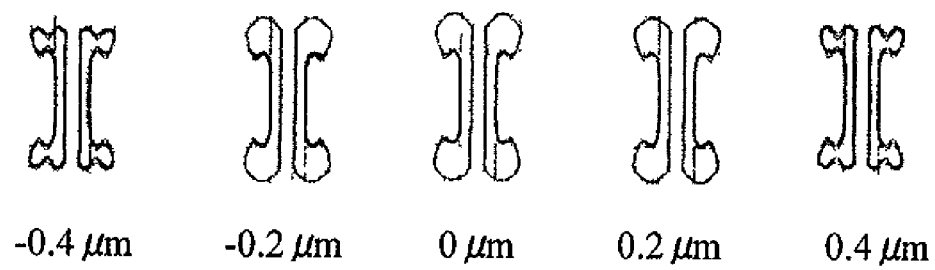

The results of these exposure operations are shown in FIG. 11. In reference to FIG. 11(A), only a minute cyclic structure is exposed when the illumination light having a peak near the optical axis in its intensity distribution is used. In reference to FIG. 11(B), only large pattern parts are exposed, and minute cyclic patterns are not resolved when the quadrupole illumination light is used. In reference to FIG. 11(C), the desired gate pattern 210 is totally resolved when the quintuple-pole illumination light is employed that makes multiple use of these illumination beams. FIGS. 11(A)–(C) show the exposure pattern characteristics when −0.4 μm~+0.4 μm are assigned laterally to the distances from the focus within the depth of focus. These show the same results as those explained in reference to FIG. 10.

As shown in FIG. 11(C), when the quintuple-pole illustration light was used, a 0.12 μm pattern was formed, which has an excellent minute pattern resolution. By dividing the line width R in the equation 1 by (λ/NA) to normalize by $k_1$, it follows that a pattern of $k_1$=0.29 was resolved.

EXAMPLE 2

Figure 13:
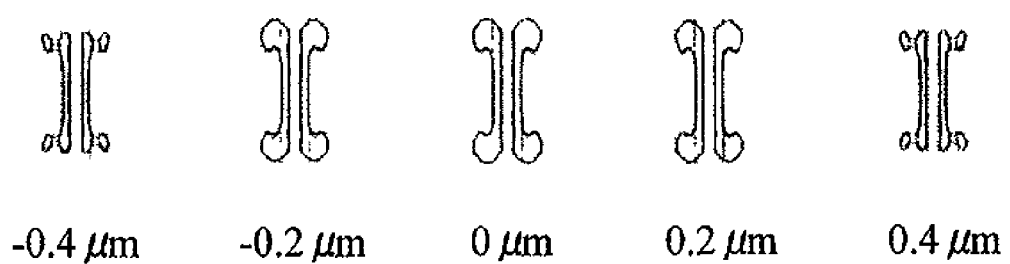
FIG. 13 is a pattern transferred to the plate when, as an exposure result of the second embodiment, the phase shift mask shown in FIG. 12 is illuminated under different illumination conditions.

For the example 2, the phase shift mask 200A shown in FIG. 12 was used, while using the aperture stop 150D as the aperture stop 150, and illumination light having a peak near the optical axis in its intensity distribution and illumination light having a peak off the axis in its intensity distribution was both used. The other exposure conditions were made the same as the example 1. The result at this time is shown in FIG. 13. It will be understood that the same result as FIG. 11(C) was obtained.

EXAMPLE 3

Figure 15:
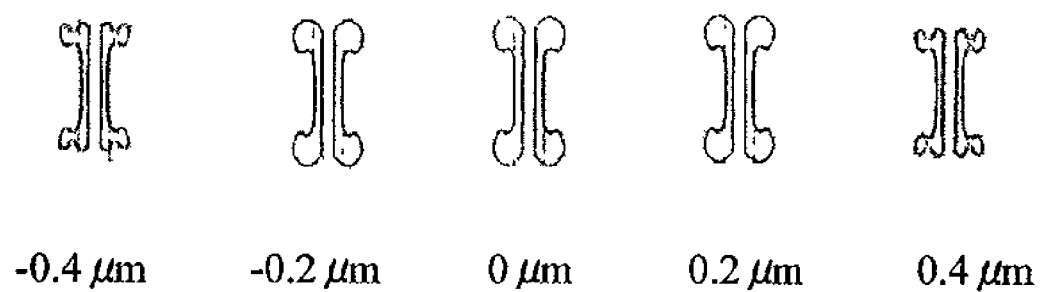
FIG. 15 is a pattern transferred to the plate when, as an exposure result of the third embodiment, the phase shift mask shown in FIG. 14 is illuminated under different illumination conditions.

For the example 3, the exposure shift mask 200B shown in FIG. 14 was used. The other exposure conditions were made the same as the example 2. The result at this time is shown in FIG. 15. It will be understood that the same result as FIG. 11(C) was obtained.

According to the present invention, a minute, complicated pattern with a minimum line width of 0.15 μm or less could be transferred onto the plate 400 at different positions within the depth of focus, with good image-forming characteristics, without exchanging the mask 200. In this example, the exposure apparatus 1, with Krf excimer laser and NA=0.6, resolved a pattern with both the minimum line width and minimum space of 0.12 μm. Further, if the resolution line width is normalized using $K_1$, $k_1$=0.29, and a pitch 0.29×2=0.58. Therefore, it became possible to expose a complicated pattern composed of a minute line width and a line width larger than that without exchanging the mask, thus forming a specified pattern on the wafer.

So far, a description has been given of the preferred embodiment of the present invention, but the present invention is not limited to these preferred embodiments, and various modifications and changes may be made in the present invention without departing from the spirit and scope thereof.

Thus, the mask, the exposure method and the apparatus of the present invention may expose a mask pattern having a minute line width (e.g., 0.15 μm or less) and a mixture of L&S patterns, and isolated and complicated patterns, without exchanging the mask, at once with high resolution. In addition, a device fabricating method utilizing such an exposure method and apparatus can fabricate high-quality devices.

What is claimed is:

1. An exposure method comprising the steps of:
   forming a phase shift mask including a desired pattern and a cyclic dummy pattern overlaid onto the desired pattern, thereby forming an overlapped area between the desired pattern and the cyclic dummy pattern a part of the desired pattern to be resolved by effects of the cyclic dummy pattern being thicker than the line width of the overlapped area of the dummy pattern; and
   illuminating the phase shift mask by using illumination light having a peak substantially on an optical axis in an intensity distribution to project light that has passed the phase shift mask onto an exposed plane via a projection optical system, thus transferring the desired pattern onto the exposed plane.

2. An exposure method according to claim 1, wherein said desired pattern comprises a first pattern part that lines up at least two first lines at a specified space and a second pattern part that includes second lines with a line width larger than the first lines, said forming step comprising the steps of:
   overlaying the first line of the first pattern part onto a dark line of the dummy pattern; and
   overlaying the second line of the second pattern part onto the dummy pattern.

3. An exposure method according to claim 1, wherein the desired pattern comprises a first pattern part that lines up at least two first lines at a specified space and a second pattern part that includes second lines with a line width larger than the first lines, and
   wherein the part of the desired pattern is the first line of the first pattern part, and the line width of the first line is made thicker than the line width of the dark line part of the dummy pattern.

4. An exposure method according to claim 1, wherein said forming step provides the desired pattern with a light shielding part, and does not provide the dummy pattern with a light shielding part.

5. An exposure method according to claim 1, wherein said forming step includes the desired pattern as a light shielding part and a light transmitting part of a half-tone phase shift type.

6. An exposure method according to claim 1, wherein the illumination light having a peak near an optical axis in an intensity distribution has a circular effective light source shape.

7. An exposure method according to claim 1, wherein the illumination light having a peak near the optical axis in an intensity distribution has σ of 0.3 or less.

8. An exposure method that exposes a desired pattern on a mask onto an exposed plane via a projection optical system, comprising the steps of:
  using a phase shift mask in which a cyclic dummy pattern overlays onto the desired pattern area and neighborhood thereby forming an overlapped area between the desired pattern and the cyclic dummy pattern, wherein the line width of the desired pattern is thicker than the overlapped area of the cyclic dummy pattern; and
  performing multiple illumination via an effective light source as illumination light, wherein the multiple illumination includes small σ illumination and large σ illumination.

9. An exposure method according to claim 8, wherein the small σ illumination has a circular effective light source shape.

10. An exposure method according to claim 8, wherein the small σ illumination has σ of 0.3 or less.

11. An exposure method according to claim 8, wherein the large σ illumination has σ of 0.6 or greater.

12. An exposure method according to claim 8, wherein the large σ illumination has an effective light source shape with σ of more than 1.

13. An exposure method according to claim 8, wherein the large σ illumination has an annular effective light source shape.

14. An exposure method according to claim 8, wherein the large σ illumination has a quadrupole effective light source shape.

15. An exposure method according to claim 14, wherein each illumination beam of the quadrupole has an equal σ.

16. A device fabricating method comprising the steps of:
  projecting and exposing an object to be exposed by using an exposure apparatus comprising an exposure mode that can perform an exposure method comprising the steps σ forming a phase shift mask including a desired pattern and a cyclic dummy pattern overlaid onto the desired pattern thereby forming an overlapped area between the desired pattern and the cyclic dummy pattern by making a part of the desired pattern to be resolved by effects of the cyclic dummy pattern thicker than the line width of the overlapped area of the cyclic dummy pattern, illuminating the phase shift mask by using illumination light having a peak near an optical axis in an intensity distribution and illumination light having a peak off an optical axis in an intensity distribution, and projecting light that has passed the phase shift mask onto an exposed plane via a projection optical system, thus transferring the desired pattern onto the exposed plane; and
  performing specified operations on the projected and exposed object.

17. A device fabricating method comprising the steps of:
  projecting an object to be exposed by using an exposure apparatus that exposes a desired pattern on a phase shift mask onto an exposed plane of the object via a projection lens, further comprising the steps of using the phase shift mask in which a minute cyclic dummy pattern overlays onto the desired pattern of the phase shift mask thereby forming an overlapped area between the desired pattern and the minute cyclic dummy pattern, wherein the line width of the desired pattern is thicker than the overlapped area of the minute cyclic dummy pattern, and performing multiple illumination via an effective light source as illumination light, wherein the mulitple illumination includes small σ illumination and large σ illumination; and
  performing specified operations on the projected and exposed object.

18. A device fabricating method comprising the steps of:
  projecting an object to be exposed by using an exposure apparatus comprising a mask, an optical system that illuminates a desired pattern on the mask, and a projection optical system that projects onto an exposed plane of the object, wherein the mask is composed of a phase shift mask in which a minute cyclic dummy pattern overlays on the desired pattern area and its neighborhood thereby forming an overlapped area between the desired pattern and the minute cyclic dummy pattern, wherein the line width of the desired pattern is thicker than the overlapped area of the minute cyclic dummy pattern, and said optical system has multiple effective light sources with small σ illumination and large σ illumination, thus having a multiple illumination system that combines such small σ illumination and large σ illumination; and
  performing specified operations on the projected and exposed object.

19. A phase shift mask comprising a desired pattern and a cyclic dummy pattern overlaid onto the desired pattern thereby forming an overlapped area between the desired pattern and the cyclic dummy pattern, wherein a part of the desired pattern to be resolved by effects of the cyclic dummy pattern is made thicker than the line width of the overlapped area of the cyclic dummy pattern.

20. A mask according to claim 19, wherein the desired pattern comprises a first pattern part that lines up at least two first lines at a specified space and a second pattern part that includes second lines with a line width larger than the first lines; and
  a part of the desired pattern is the first line of the first pattern part, and the line width of the first line is thicker than the line width of a dark line part of the dummy pattern.

21. A mask according to claim 19, wherein the desired pattern is equipped with a light shielding part, and the dummy pattern is not equipped with a light shielding part.

22. A mask according to claim 19, wherein the desired pattern of the phase shift mask is comprised of a light shielding part and a light transmitting part of a half-tone phase shift type.

23. A mask fabricating method comprising the steps of:
  forming a desired pattern onto a mask;
  overlaying a cyclic dummy pattern onto the desired pattern thereby forming an overlapped area between the desired pattern and the cyclic dummy pattern; and
  fabricating the mask as a phase shift mask by making a part of the desired pattern thicker than the overlapped area of the dummy pattern.

* * * * *